United States Patent
Krishnasamy Maniam et al.

(10) Patent No.: US 10,965,331 B2
(45) Date of Patent: Mar. 30, 2021

(54) BROAD RANGE VOLTAGE-CONTROLLED OSCILLATOR

(71) Applicant: SEMICONDUCTOR COMPONENTS INDUSTRIES, LLC, Phoenix, AZ (US)

(72) Inventors: Nuntha Kumar Krishnasamy Maniam, Cupertino, CA (US); Didier Margairaz, San Jose, CA (US); Benjamin Huat Neo, Fremont, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/835,052

(22) Filed: Mar. 30, 2020

(65) Prior Publication Data

US 2020/0336160 A1 Oct. 22, 2020

Related U.S. Application Data

(60) Provisional application No. 62/837,113, filed on Apr. 22, 2019.

(51) Int. Cl.
*H04B 1/04* (2006.01)
*H03K 21/00* (2006.01)
(Continued)

(52) U.S. Cl.
CPC .............. *H04B 1/04* (2013.01); *H03B 5/12* (2013.01); *H03D 7/12* (2013.01); *H03K 21/00* (2013.01)

(58) Field of Classification Search
CPC ...... H03B 5/1215; H03B 5/1265; H03B 5/08; H03B 5/12; H03B 5/1212; H04B 10/613;
(Continued)

(56) References Cited

U.S. PATENT DOCUMENTS 8,742,859 B2 *  6/2014  Jin ..................... H01F 27/2804
                                              331/117 FE
9,948,313 B1 *  4/2018  Rafi ........................ H01L 28/60
(Continued)

OTHER PUBLICATIONS

Pengfei Zhang et al., "A 5-GHz Direct-Conversion CMOS Transceiver," IEEE Journal of Solid-State Circuits, vol. 38, No. 12, Dec. 2003, pp. 2232-2238.
(Continued)

*Primary Examiner* — Emmanuel Bayard
(74) *Attorney, Agent, or Firm* — Ramey & Schwaller, LLP

(57) ABSTRACT

An integrated circuit comprising: a substrate; a configurable tank circuit on the substrate, the configurable tank circuit including: a first pair of inductive loops driven in parallel in each of a first configuration and a second configuration, each of the inductive loops in the first pair enclosing a corresponding capacitive element connected in parallel with that inductive loop; a second pair of inductive loops driven in parallel with the first pair of loops in the second configuration, the second pair of inductive loops undriven in the first configuration; and a switch arrangement that alternately places the configurable tank circuit into either of the first and second configurations; and an oscillation driver that drives the configurable tank circuit at a tunable resonance frequency.

22 Claims, 15 Drawing Sheets

(51) Int. Cl.
*H03D 7/12* (2006.01)
*H03B 5/12* (2006.01)

(58) Field of Classification Search
CPC .......... H04B 10/504; H04B 1/04; H04B 1/40; H03K 21/00
USPC ......... 375/295, 297, 298, 300–303, 306–308
See application file for complete search history.

(56) References Cited

U.S. PATENT DOCUMENTS

| | | | |
|---|---|---|---|
| 10,483,910 B2 | 11/2019 | Gao | |
| 2005/0253660 A1* | 11/2005 | Shi | H03B 5/1215 331/57 |
| 2009/0156135 A1* | 6/2009 | Kamizuma | H04B 1/0082 455/73 |
| 2009/0243743 A1* | 10/2009 | Kossel | H03B 5/1253 331/179 |
| 2012/0120992 A1* | 5/2012 | Soltanian | H03L 7/193 375/221 |
| 2012/0169384 A1* | 7/2012 | Holzleitner | H03B 19/00 327/117 |
| 2012/0256673 A1* | 10/2012 | Fujibayashi | H04L 27/366 327/238 |
| 2015/0065068 A1* | 3/2015 | Mattsson | H01L 28/10 455/90.2 |
| 2016/0118964 A1* | 4/2016 | Chueh | H03B 19/14 327/122 |
| 2016/0351309 A1* | 12/2016 | Caffee | H03B 5/00 |
| 2017/0359024 A1* | 12/2017 | Lin | H03B 5/1215 |
| 2018/0190424 A1* | 7/2018 | Caffee | H01L 23/50 |
| 2018/0294681 A1* | 10/2018 | Bae | H02J 50/90 |
| 2018/0351559 A1* | 12/2018 | Shiraishi | H03L 7/093 |
| 2019/0058441 A1* | 2/2019 | Shiraishi | H04B 10/6165 |
| 2019/0326856 A1* | 10/2019 | Shiraishi | H03B 5/1228 |
| 2019/0372576 A1* | 12/2019 | Jung | H03B 5/1265 |
| 2020/0098500 A1* | 3/2020 | Terrovitis | H01F 17/0006 |

OTHER PUBLICATIONS

Yorgos Palaskas et al., "A 5-GHz 108-Mb/s 2 2 MIMO Transceiver RFIC With Fully Integrated 20.5-dBm P1dB Power Amplifiers in 90-nm CMOS," IEEE Journal of Solid-State Circuits, vol. 41, No. 12, Dec. 2006, pp. 2746-2756.

Yuan-Hung Chung et al. "A Dual-Band 802.011 abgn/ac Transceiver with Integrated PA and T/R Switch in a Digital Noise Controlled SoC," IEEE 978-1-4799-8682-8/2015, 8 pages.

"Basics of Electrical Engineering, Series vs Parallel Circuit Configuration," available at: http://www.basicsofelectricalengineering.com/2018/02/series-vs-parallel-circuit-configuration.html, Feb. 13, 2018, 6 pages, printed on Oct. 14, 2020.

\* cited by examiner

BROAD RANGE VOLTAGE-CONTROLLED OSCILLATOR

CROSS-REFERENCE TO RELATED APPLICATION

This application claims priority benefit of U.S. provisional application No. 62/837,113, which was filed on Apr. 22, 2019, and which is entirely incorporated by reference herein.

TECHNICAL FIELD

This disclosure pertains generally to wireless communications and particularly to broad range voltage-controlled oscillators (VCO).

BACKGROUND

Wi-Fi® circuits traditionally service frequency ranges up to 6 GHz. With improvements in communication services, however, Wi-Fi transmitters will increasingly be called upon to operate at higher frequencies with minimal increases in power consumption and phase noise. Thus, there is room for improvement in the art.

SUMMARY

An example of this disclosure is an integrated circuit comprising: a substrate; a configurable tank circuit on the substrate, the configurable tank circuit including: a first pair of inductive loops driven in parallel in each of a first configuration and a second configuration, each of the inductive loops in the first pair enclosing a corresponding capacitive element connected in parallel with that inductive loop; a second pair of inductive loops driven in parallel with the first pair of loops in the second configuration, the second pair of inductive loops undriven in the first configuration; and a switch arrangement that alternately places the configurable tank circuit into either of the first and second configurations; and an oscillation driver that drives the configurable tank circuit at a tunable resonance frequency.

An example of this disclosure is an integrated wireless communications signal transmitter that comprises: a voltage-controlled oscillator producing a reference frequency; a frequency divider that converts the reference frequency into in-phase carrier signals and quadrature half-frequency carrier signals; a mixer that produces a transmit signal by combining the in-phase carrier signals and the quadrature half-frequency carrier signals with in-phase wireless modulation signals and quadrature wireless modulation signals; and an output pin that couples the transmit signal to an antenna.

An example of this disclosure is a method for operating a tank circuit, comprising: receiving a drive signal at a tank circuit in a first configuration; driving the tank circuit in the first configuration based on the drive signal, where driving the tank circuit in the first configuration comprises driving a first pair of inductive loops in parallel, and where each of the inductive loops in the first pair encloses a corresponding capacitive element connected in parallel with that inductive loop; placing, using a switch arrangement, the tank circuit into a second configuration; and driving, responsive to placing the tank circuit into the second configuration, a second pair of inductive loops in parallel with the first pair of loops.

An example of this disclosure is an integrated wireless communication signal transmitter that comprises: a voltage-controlled oscillator producing a reference signal having a reference frequency; a first filter that derives an in-phase reference signal and a quadrature phase reference signal from the reference signal, the in-phase reference signal and the quadrature phase reference signal having the reference frequency; a first mixer that combines the in-phase reference signal with the quadrature phase reference signal to produce a double-frequency signal; a second filter that derives an in-phase double-frequency signal and a quadrature phase double-frequency signal from the double-frequency signal, the in-phase double-frequency signal and the quadrature phase double-frequency signal each having twice the reference frequency; and a mixer arrangement that combines the reference signal and the quadrature phase reference signal with the in-phase double-frequency signal and the quadrature phase double-frequency signal to produce a triple-frequency signal.

The figures and the following detailed description do not limit the disclosure, but on the contrary, they provide the foundation for understanding all modifications, equivalents, and alternatives falling within the scope of the appended claims. Specific configurations, parameter values, and examples are explanatory, not restrictive.

DETAILED DESCRIPTION

An example aspect of this disclosure includes one or more example implementations that enable wireless communications (e.g., Wi-Fi®) in the 6 GHz band (5.925 GHz to 7.125 GHz) while maintaining backward compatibility with multiple frequency ranges (e.g., 5 GHz band). Another example aspect of one or more example implementations enable tripling of a frequency generated by a VCO. The capabilities, as described herein, to triple the frequency received from a VCO enable high communications frequencies to function without requiring a higher frequency VCO. Accordingly, example implementations can utilize lower frequency VCOs that draw less power and create less phase noise than a higher frequency VCO.

Another example aspect of one or more examples of this disclosure is that the one or more examples enable tripling of the (effective) bandwidth of a VCO. Further, one or more examples of this disclosure provide an architecture which not only triples input frequencies but also eliminates unwanted tones from a transceiver (e.g., a DC component of a signal) through exploitation of constructive/destructive interference and mixing. Other examples of this disclosure enable high operating frequencies and broad band widths while consuming less power and occupying less space than would be required for prior art solutions to allow for similar operating frequencies and broad band widths.

Figure 1A:
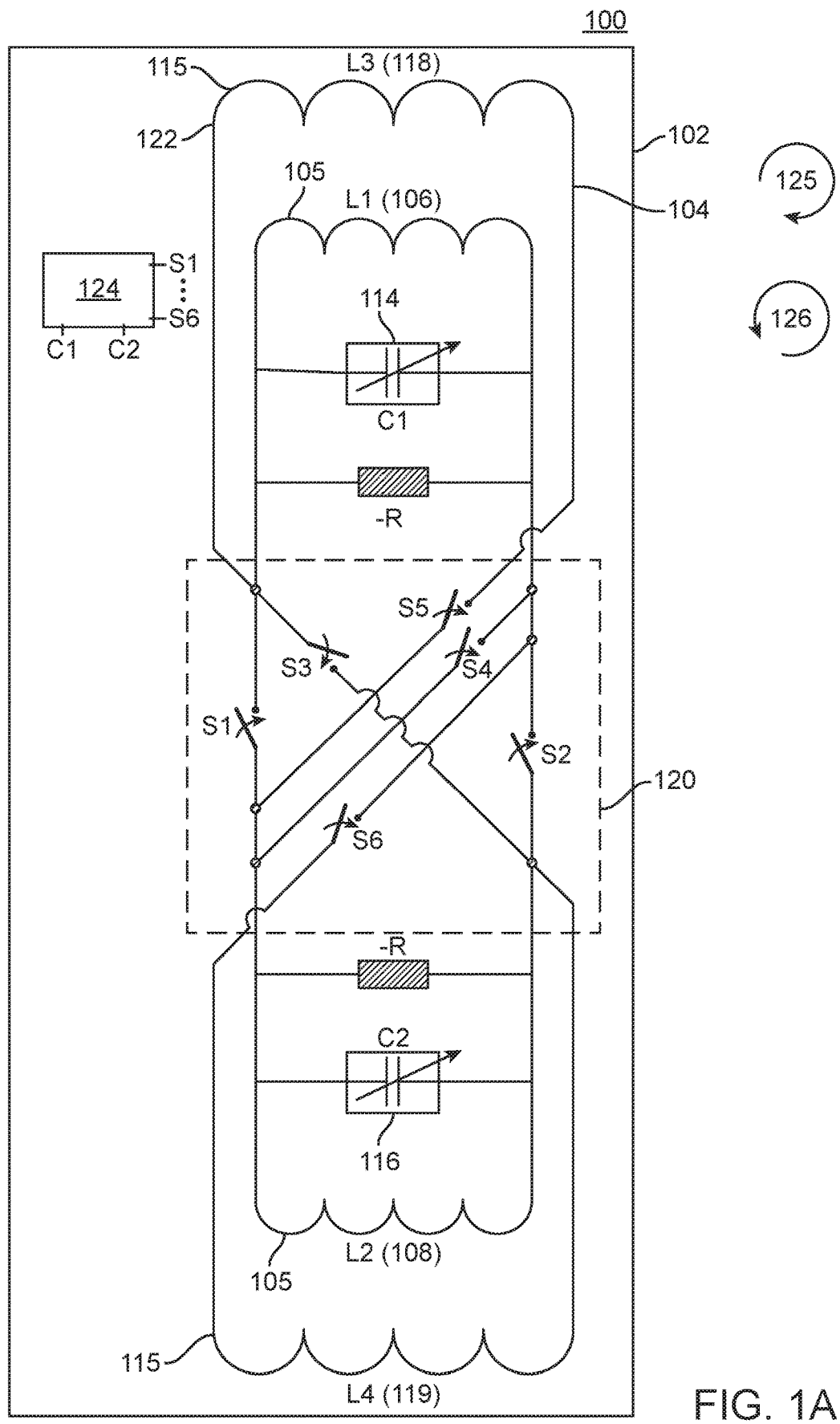
FIG. 1A illustrates an integrated circuit, in accordance with an example of this disclosure.

FIG. 1A illustrates an integrated circuit 100, in accordance with an example of this disclosure. The integrated circuit 100 includes a configurable tank circuit 104 which resides on a substrate 102. In one or more examples of this disclosure the substrate 102 is composed of one or more semi-conductive materials. Components of the tank circuit 104 are in signal communication with processor 124. In one or more examples of this disclosure, the tank circuit 104 and the processor 124 reside on different chips. In one or more examples of this disclosure, the tank circuit 104 and the processor 124 reside on the same chip. The configurable tank circuit 104 includes a first inductive loop 106 and a second inductive loop 108.

Inductive loop 106 and inductive loop 108 form a first pair 105 of inductive loops. Inductive loop 106 comprises an inductor L1. Inductive loop 108 comprises inductor L2. Inductive loop 106 encloses a first capacitive element 114 (C1) and a negative resistive value (−R). In at least one example of this disclosure, negative resistive value (−R) may be provided by an active transistor (not shown). Such active transistor may also provide bias current to the tank circuit 104. In some examples of this disclosure, capacitive element C1114 includes a bank of digitally controllable capacitors (not shown). Capacitive element C1 114 is connected to processor 124. Processor 124 can cause the capacitance of capacitive element C1 114 to change. In one or more examples of this disclosure, processor 124 controls capacitive element C1 114 by varying the voltage across one or more of the digitally controllable capacitors. Capacitive element C1 114 is connected in parallel with inductive loop 106.

Inductive loop 108 encloses a second capacitive element (C2) 116 and negative resistive value (−R). In some examples of this disclosure, capacitive element C2 116 includes a bank of digitally controllable capacitors (not shown). Capacitive element C2 116 is connected to processor 124. Processor 124 can cause the capacitance of capacitive element C2 116 to change. In one or more examples of this disclosure, processor 124 controls capacitive element C2 116 by varying the voltage across one or more of the digitally controllable capacitors. Capacitive element C2 116 is connected in parallel with inductive loop 108.

The configurable tank circuit 104 also includes a third inductive loop 118 and a fourth inductive loop 119. Inductive loop 118 comprises inductor L3 and inductive loop 119 comprises inductor L4. Inductive loop 118 encloses inductive loop 106 and inductive loop 119 encloses inductive loop 108. Integrated circuit 104 also includes a switch arrangement 120. Switch arrangement 120 includes six switches, switch S1, switch S2, switch S3, switch S4, switch S5, and switch S6, each of which is controlled by processor 124. As shown in FIG. 1A, inductive loop 106, inductive loop 108, inductive loop 118, and inductive loop 119, and their constituents connected to switch arrangement 120. Switch arrangement 120 is controlled by processor 124 to place the tank circuit 104 into either of two configurations (110, 112). The tank circuit 104 includes an oscillation driver (see 202, FIG. 2) that drives the tank circuit 104 at a resonance frequency. The resonance frequency is tunable by operation of the processor 124 on capacitive element C1 114, capacitive element C2 116, and switch arrangement 120.

In at least one example of this disclosure, the inductance of inductor L1 (106) is 150 pH, the inductance of inductor L2 (108) is 150 pH, the inductance of inductor L3 (118) is 350 pH, the inductance of inductor L4 (119) is 350 pH, and the capacitance of capacitive element C1 114 and capacitive element C2 116 are adjustable over a range of 0.32 pF to 1.25 pF. The absolute value of −R is 50 Ohms.

Figure 1B:
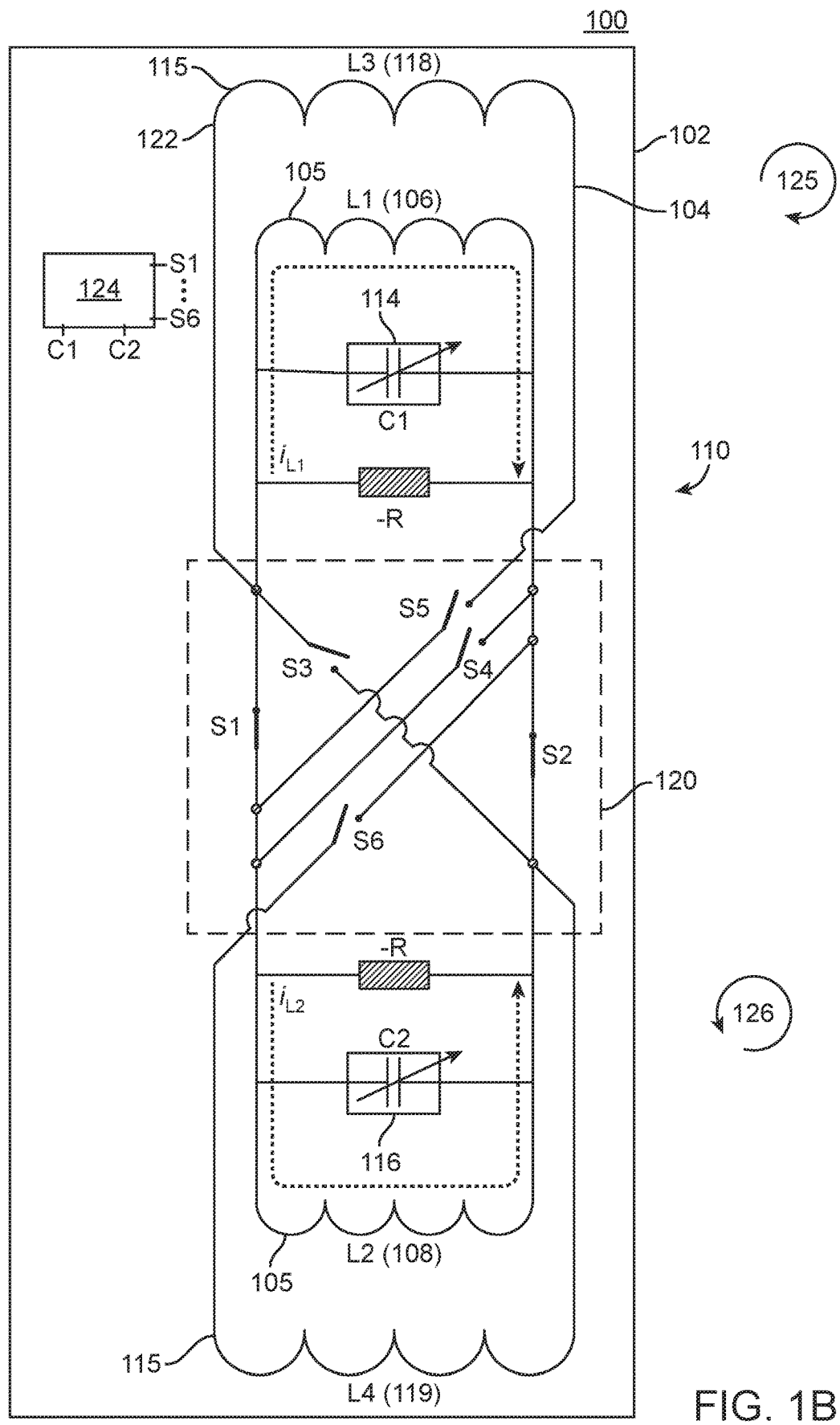
FIG. 1B illustrates the integrated circuit of FIG. 1A operating in a first configuration, in accordance with an example of this disclosure.

FIG. 1B illustrates integrated circuit 100 operating in a first configuration 110 at a first moment, in accordance with an example of this disclosure. Switch arrangement 120 has placed integrated circuit 100 into the first configuration 110. In the first configuration 110, switch S1 and switch S2 are closed, while switch S3, switch S4, switch S5, and switch S6 are open. When the tank circuit 104 is in the first configuration 110, inductive loop 106 is driven in parallel with inductive loop 108 in response to the frequency input from the oscillation driver, (see 202, FIG. 2). Current iL1 is induced in inductive loop 106 and flows in a clockwise direction 125 as shown. Current iL2 is induced in inductive loop 108 and flows counterclockwise 126 as shown. When the tank circuit 104 is in the first configuration 110, inductive loop 118 and inductive loop 119 are not driven. In the first configuration 110, the tank circuit 104 operates in a low frequency mode. In the low frequency mode, the output frequency of tank circuit 104 is expressible as:

$$Fvco(\text{low}) = \frac{1}{2\pi\sqrt{L12 \times C}},$$

where L12=[L1*L2]/[L1+L2] and C=C1+C2.

Figure 1C:
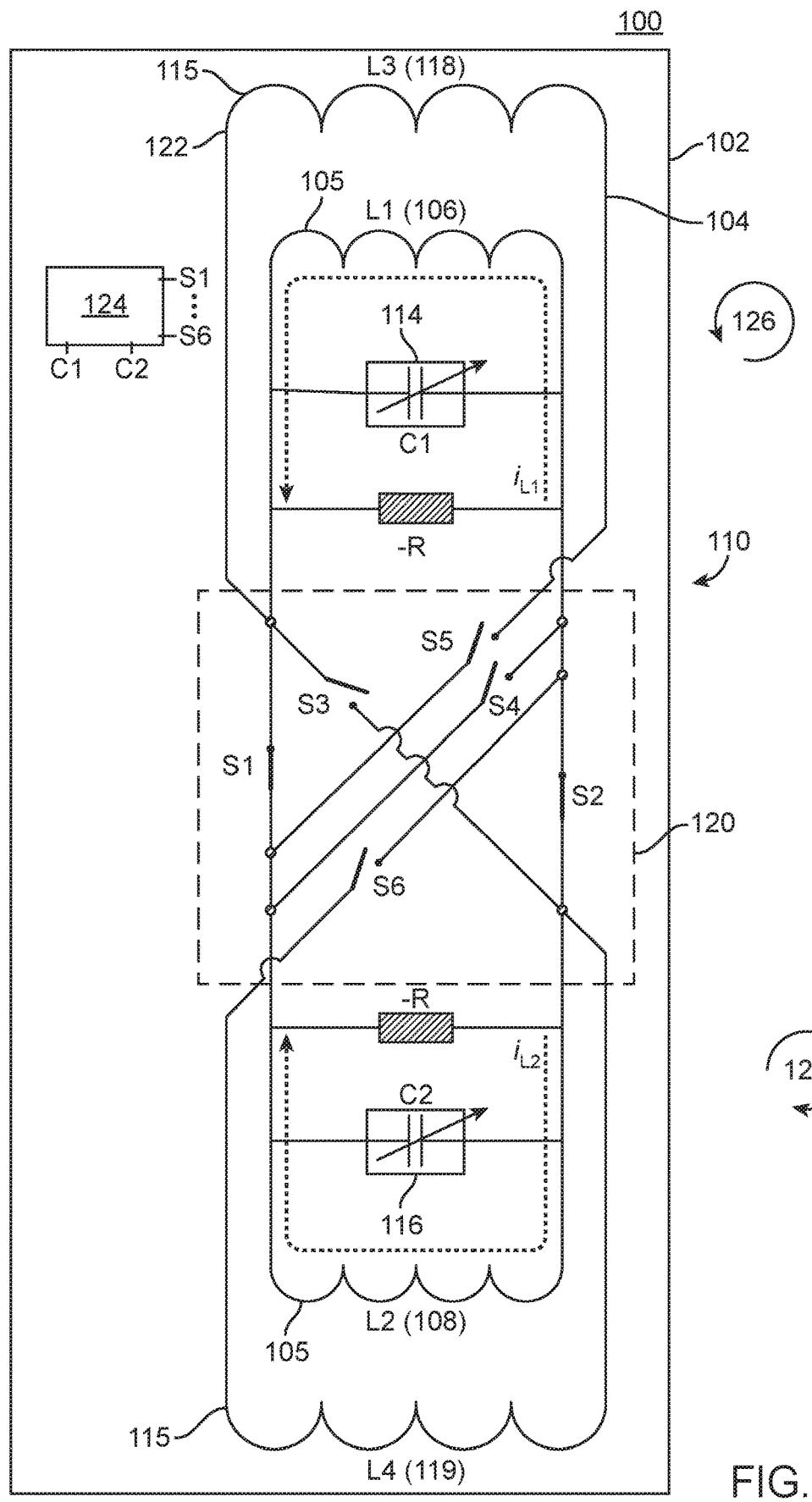
FIG. 1C also illustrates the integrated circuit of FIG. 1A operating in the first configuration, in accordance with an example of this disclosure.

FIG. 1C illustrates integrated circuit 100 operating in the first configuration 110, but at a different moment from the moment of FIG. 1B. In the moment illustrated in FIG. 1C, induced current iL1 in inductive loop 106 flows in a counterclockwise direction 126, whereas induced current iL2 is carried in a clockwise direction 125 in inductive loop 108. The direction of current iL1 and iL2 depends on the polarity of the input voltage from the oscillation driver, (see 202, FIG. 2). During operation of the tank circuit 104 in the first configuration 110, direction of current in tank circuit 104 will alternate between that shown in FIG. 1B and FIG. 1C.

To recapitulate, when the tank circuit 104 is in the first configuration 110, if current iL1 in loop 106 is flowing clockwise, then current iL2 in loop 108 will be flowing counterclockwise as shown in FIG. 1B. Similarly, if current iL2 in loop 108 is flowing clockwise, then current iL1 is flowing counterclockwise, as shown in FIG. 1C. Thus, in the first configuration 110 of tank circuit 104, the inductive loops 106, 108 of the first pair 105 carry current in opposing directions, with one loop (e.g., 106) carrying current in a first direction (e.g., clockwise 124), and the other loop (e.g., 108) carrying current in an opposing direction (e.g., counterclockwise 126).

Figure 1D:
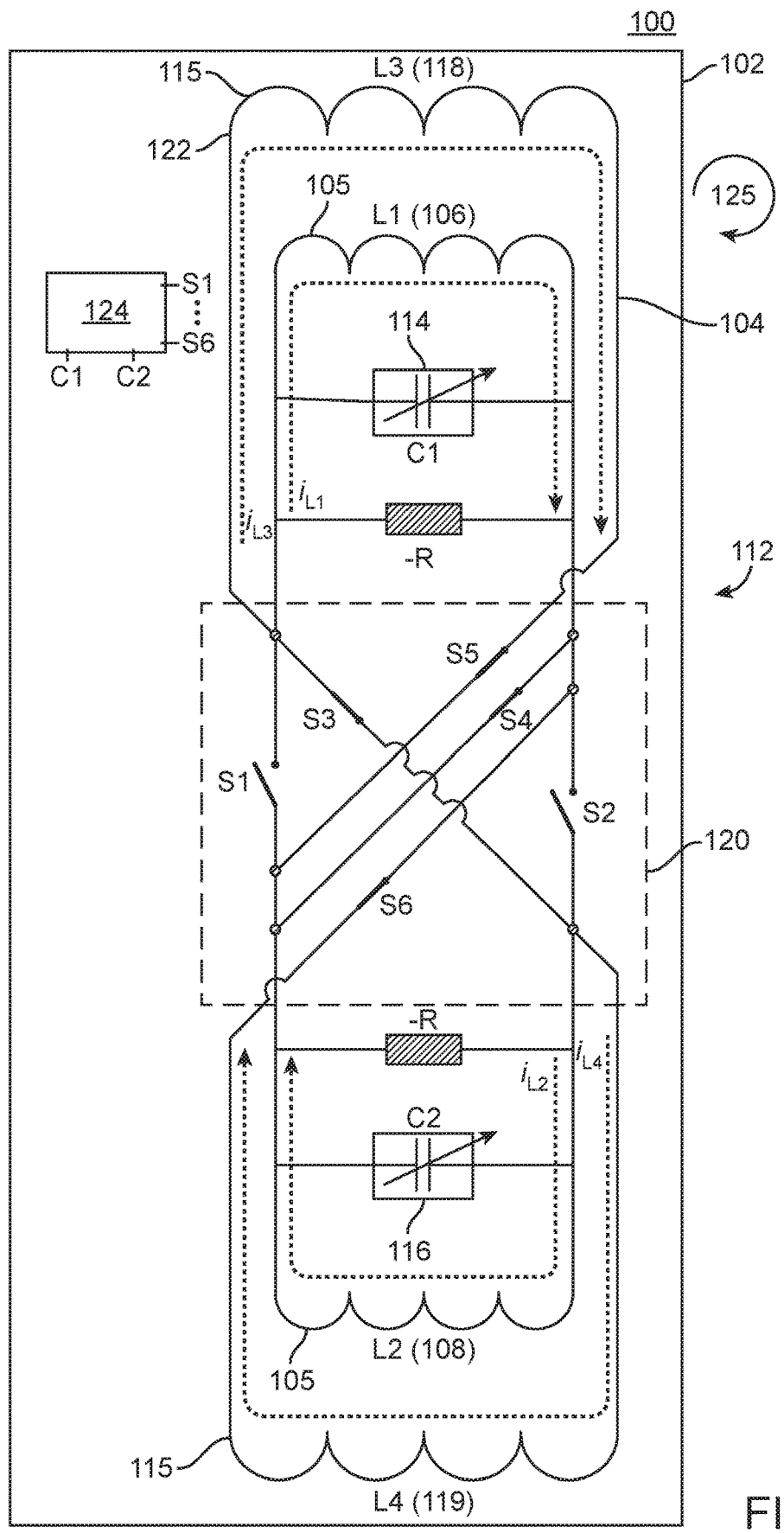
FIG. 1D illustrates the integrated circuit of FIG. 1A operating in a second configuration, in accordance with an example of this disclosure.

FIG. 1D illustrates integrated circuit 100 operating in a second configuration 112 at a first moment, in accordance with an example of this disclosure. Switch arrangement 120 has placed integrated circuit 100 into the second configuration 112. In the second configuration 112, switch S1 and switch S2 are open, while switch S3, switch S4, switch S5, and switch S6 are closed. When the tank circuit 104 is in the second configuration 112, inductive loop 106 is driven in parallel with inductive loop 108 in response to the frequency input from the oscillation driver, (see 202, FIG. 2). When the tank circuit 104 is in the second configuration 112, inductive loop 118 is driven in parallel with inductive loop 119. When the tank circuit 104 is in the second configuration 112, the first pair 105 of inductive loops (106, 108) is driven in parallel with the second pair 115 of inductive loops (118, 119). Current iL1 is induced in inductive loop 106, current iL2 is induced in inductive loop 108, current iL3 is induced in loop 118, and current iL4 is induced in loop 119. Currents iL1, iL2, iL3, and iL4 all flow in a clockwise direction 125. In the second configuration 112, the tank circuit 104 operates in a high frequency mode. In the high frequency mode, the output frequency of tank circuit 104 is expressible as:

$$Fvco(\text{high}) = \frac{1}{2\pi\sqrt{L1234 \times C}},$$

where L1234=1/[(1/L1)+(1/L2)+(1/L3)+(1/L4)] and C=C1+C2. In at least one example, when operating in the high frequency mode, the output signal of the tank circuit 104 has a frequency of 14.125 GHz, which is 34 percent higher than the 10 GHz frequency of the first (low frequency) operating mode of FIGS. 1B-1C.

Figure 1E:
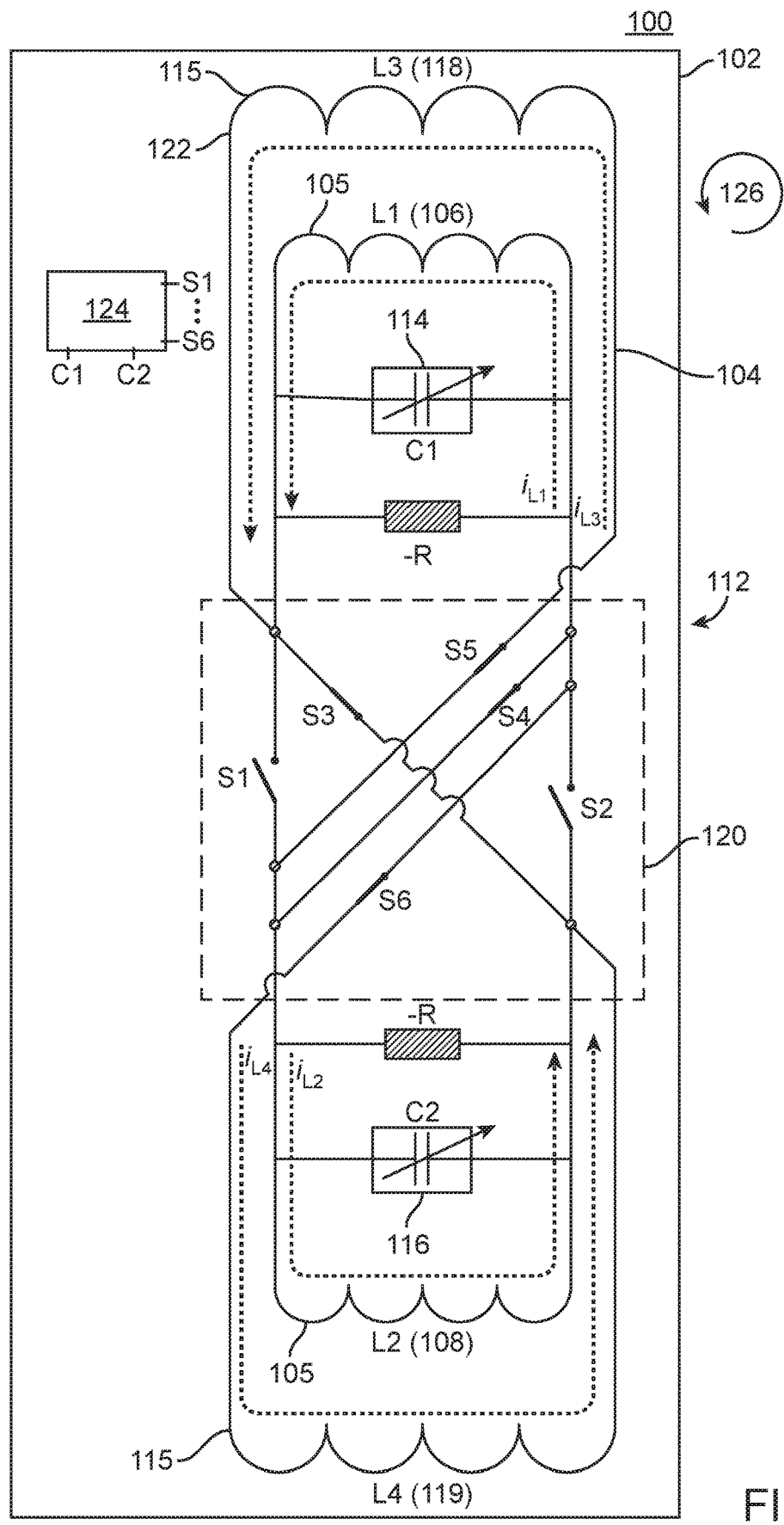
FIG. 1E also illustrates the integrated circuit of FIG. 1A operating in the second configuration, in accordance with an example of this disclosure.

FIG. 1E illustrates integrated circuit 100 operating in the second configuration 112, but at a different moment from FIG. 1D. In the moment illustrated in FIG. 1E, induced current iL1 flows counterclockwise 126 in inductive loop 106, induced current iL2 flows counterclockwise 126 in inductive loop 108, induced current iL3 flows counterclockwise 126 in inductive loop 118, and induced current iL4 flows counterclockwise 126 in inductive loop 119.

Figure 2:
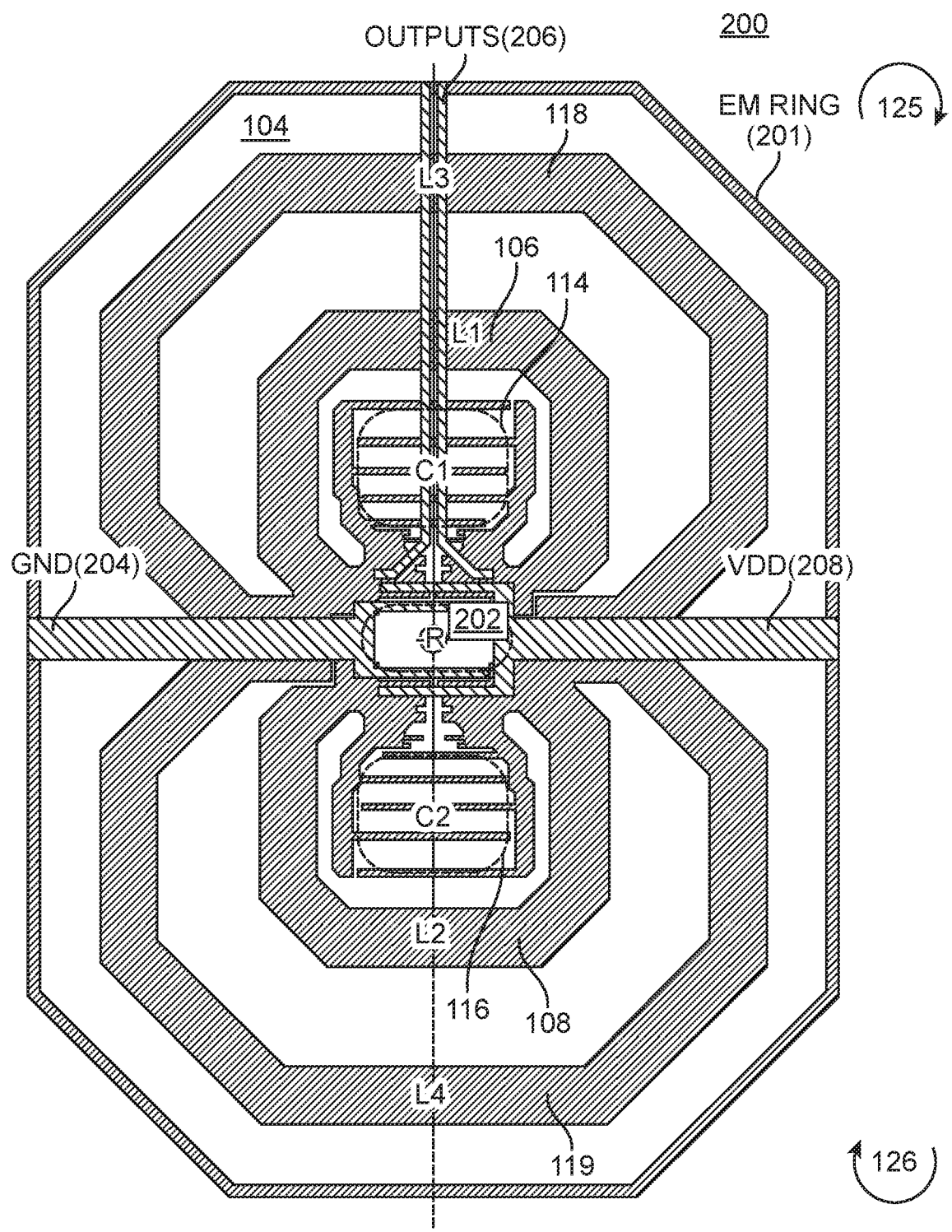
FIG. 2 illustrates aspects of the integrated circuit of FIGS. 1A-1E, in accordance with an example of this disclosure.

The direction of currents iL1, iL2, iL3, and iL4 depends on the polarity of the input voltage from the oscillation driver, (see 202, FIG. 2). During operation of the tank circuit 104 in the second configuration 112, direction of current in the tank circuit 104 will alternate between that shown in FIG. 1D and that shown in FIG. 1E.

To sum up, when the tank circuit 104 is in the second configuration 112, if current iL1 in loop 106 is flowing clockwise, then current iL2 in loop 108 will be flowing clockwise too (see FIG. 1D). Similarly, if current iL2 in loop 108 is flowing counterclockwise, then current iL1 is also flowing counterclockwise (see FIG. 1D).

Thus, in the second configuration 112, the inductive loops 106, 108 of the inner pair 105 carry currents in a shared direction. For example, in the second configuration 112 of tank circuit 104, both loops 106, 108 will carry current in a clockwise direction 124 or in a counterclockwise direction 126. In the second configuration 112, (inner) loop 106 carries current in the same direction as (outer) loop 118, while (inner) loop 108 carries current in the same direction as (outer) loop 119. In the second configuration 112 currents iL1, iL2, iL3 and iL4 flow in the same (shared) direction within their respective loop (106, 108, 118, 119).

FIG. 2 illustrates aspects of an integrated circuit 200 (e.g., 100), in accordance with an example of this disclosure. In accordance with one or more examples of this disclosure the circuit 200 resides on a substrate. As noted in the discussion of FIGS. 1A-1E, circuit 200 includes a first inductive loop 106 and a second inductive loop 108. Inductive loop 106 and inductive loop 108 form a first pair of inductive loops. Inductive loop 106 comprises inductor L1, and inductive loop 108 comprises inductor L2. Inductive loop 106 encloses capacitive element C1 114 and negative resistive value (−R). Capacitive element C1 114 is connected to processor (124). Processor (124) can cause the capacitance of capacitive element C1 114 to change. Capacitive element C1 114 is connected in parallel with inductive loop 106.

Inductive loop 108 encloses a second capacitive element (C2) 116 and negative resistive value (−R). Like capacitive element C1 114, capacitive element C2 116 is connected to processor (124). In one or more examples of this disclosure, processor (124) controls capacitive element C2 116 by varying the voltage across one or more components of the capacitive element C2 116. As noted in the discussion of FIGS. 1A-1E, capacitive element C2 116 is connected in parallel with inductive loop 108. Circuit 200 includes a third inductive loop 118 and a fourth inductive loop 119. Inductive loop 118 comprises inductor L3 and inductive loop 119 comprises inductor L4. Inductive loop 118 encloses inductive loop 106 and inductive loop 119 encloses inductive loop 108.

Circuit 200 includes an oscillation driver 202 that drives the tank circuit 104 at a resonance frequency (making the tank circuit 104 a voltage-controlled oscillator). In at least one example of this disclosure, oscillator driver 202 provides negative resistance value (−R) and a voltage-controlled capacitor (not shown) for tuning capacitive elements C1 114 and C2 116. The resonance frequency is tunable by operation of the processor (124) on capacitive element C1 114, capacitive element C2 116, and switch arrangement (120, see FIGS. 1A-1E). The tank circuit 104 receives input voltage (VDD) 208 and is connected to local ground (GND) 204. The input resonance frequency from driver 202 is tunable as output 206 from the tank circuit 104. Tank circuit 104 is surrounded by an electromagnetic ring 201. In at least one example, the electromagnetic ring 201 is composed of solid metal and serves to minimize unwanted coupling by circuit 200 components (e.g., tank circuit 104) with external circuitry (not shown).

Figure 3A:
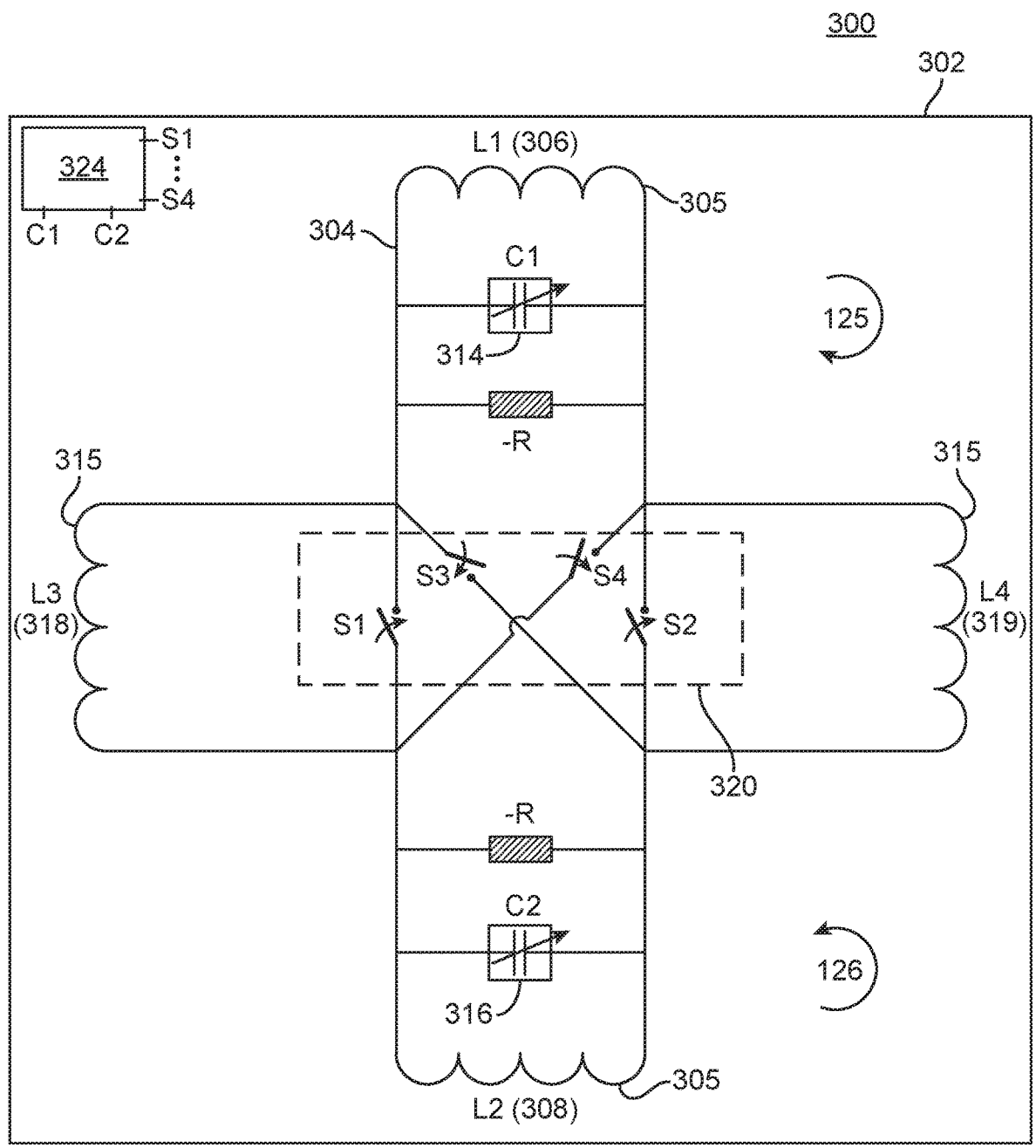
FIG. 3A illustrates another integrated circuit, in accordance with an example of this disclosure.

FIG. 3A illustrates an integrated circuit 300, in accordance with an example of this disclosure. The integrated circuit 300 includes a configurable tank circuit 304 which resides on a substrate 302. In one or more examples of this disclosure the substrate 302 is composed of one or more semi-conductive materials. Components of the tank circuit 304 are in signal communication with processor 324. In one or more examples of this disclosure, the tank circuit 304 and the processor 324 reside on different chips. In one or more examples of this disclosure, the tank circuit 304 and the processor 324 reside on the same chip. The configurable tank circuit 304 includes a first inductive loop 306 and a second inductive loop 308.

Inductive loop 306 and inductive loop 308 form a first pair 305 of inductive loops. Inductive loop 306 comprises an inductor L1. Inductive loop 308 also comprises an inductor L2. Inductive loop 306 encloses a first capacitive element (C1) 314 and a negative resistive value (−R). In some examples of this disclosure, capacitive element C1 314 includes a bank of digitally controllable capacitors (not shown). Capacitive element C1 314 is connected to processor 324. Processor 324 can cause the capacitance of capacitive element C1 314 to change. In one or more examples of this disclosure, processor 324 controls capacitive element C1 314 by varying the voltage across one or more of the digitally controllable capacitors. Capacitive element C1 314 is connected in parallel with inductive loop 306.

Inductive loop 308 encloses a second capacitive element (C2) 316 and a negative resistive value (−R). In some examples of this disclosure, capacitive element C2 316 includes a bank of digitally controllable capacitors (not shown). Capacitive element C2 316 is connected to processor 324. Processor 324 can cause the capacitance of capacitive element C2 316 to change. In one or more examples of this disclosure, processor 324 controls capacitive element C2 316 by varying the voltage across one or more of the digitally controllable capacitors. Capacitive element C2 316 is connected in parallel with inductive loop 308.

The configurable tank circuit 304 also includes a third inductive loop 318 and a fourth inductive loop 319. Inductive loop 318 comprises inductor L3 and inductive loop 319 comprises inductor L4. Integrated circuit 300 also includes a switch arrangement 320. Switch arrangement 320 includes four switches, switch S1, switch S2, switch S3, and switch S4, each of which is controlled by processor 324. As shown in FIG. 3A, inductive loop 306, inductive loop 308, inductive loop 318, and inductive loop 319, and their constituents are connected to switch arrangement 320. Switch arrangement 320 is controlled by processor 324 to place the tank circuit 304 into either of two configurations (310, 312). The tank circuit 304 includes an oscillation driver (see FIG. 4) that drives the tank circuit 304 at a resonance frequency. The resonance frequency is tunable by operation of the processor 324 on capacitive element C1 314, capacitive element C2 316, and switch arrangement 320.

In at least one example of this disclosure, the inductance of L1 (306), L2 (308) L3 (318), and L4 (319) is 330 pH, the capacitance of capacitive element C1 (314) and capacitive element C2 (316) are adjustable over a range of 0.32 pF to 1.25 pF, and the absolute value of −R is 50 Ohms.

Figure 3B:
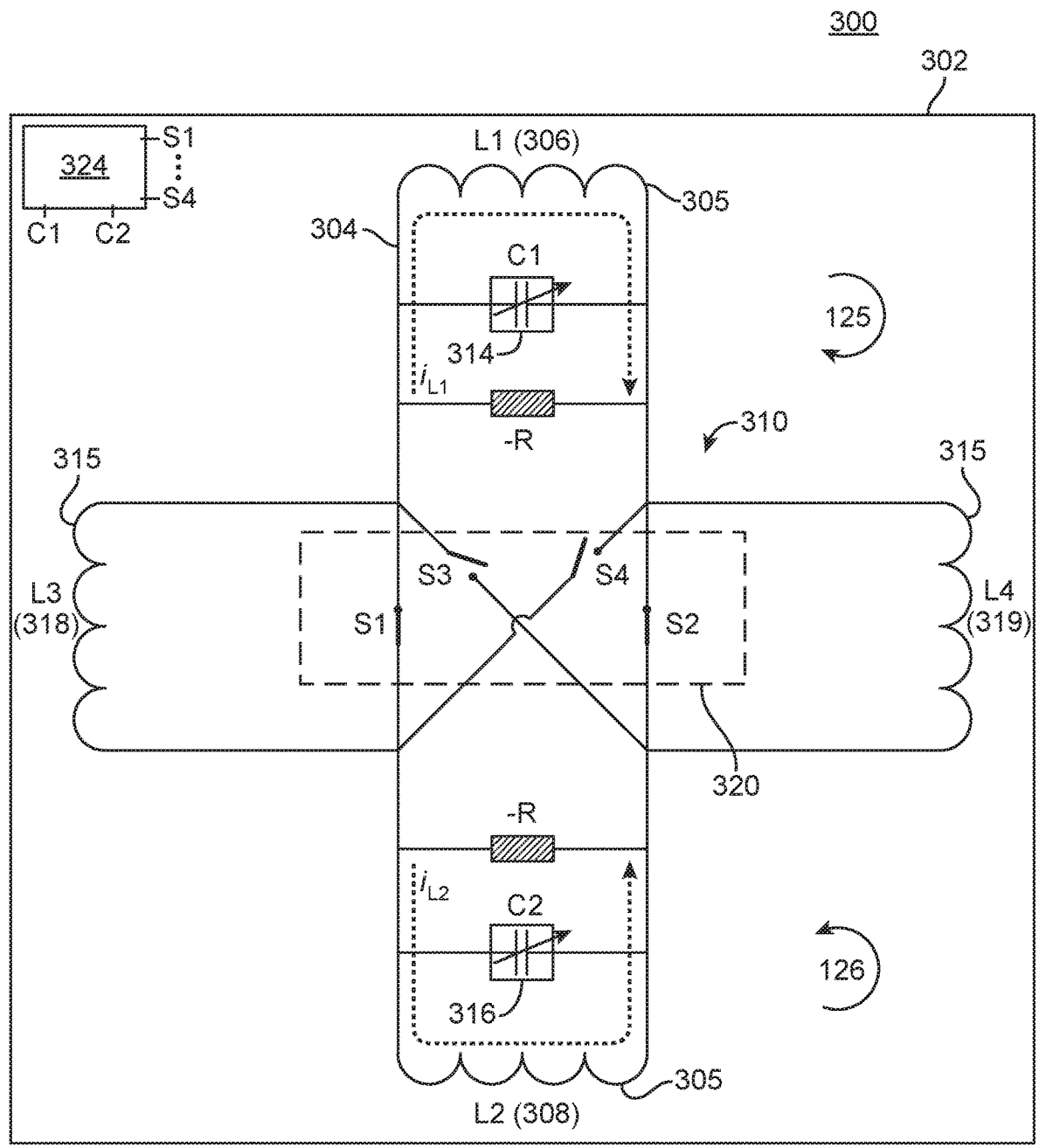
FIG. 3B illustrates the integrated circuit of FIG. 3A operating in a first configuration, in accordance with an example of this disclosure.

FIG. 3B illustrates integrated circuit 300 operating in a first configuration 310 at a first moment, in accordance with an example of this disclosure. Switch arrangement 320 has placed integrated circuit 300 into the first configuration 310. In the first configuration 310, switch S1 and switch S2 are closed, while switch S3 and switch S4 are open. When the tank circuit 304 is in the first configuration 310, inductive loop 306 is driven in parallel with inductive loop 308 in response to the frequency input from an oscillation driver, (see 402, FIG. 4). Current iL1 is induced in inductive loop 306 and flows in a clockwise direction 125 as shown. Current iL2 is induced in inductive loop 308 and flows counterclockwise 126 as shown. Thus, in the first configuration 310, the inductive loops (306, 308) of the first pair 305 carry currents in opposing directions. When the tank circuit 304 is in the first configuration 310, inductive loop 318 and inductive loop 319 are not driven.

In the first configuration 310 of the tank circuit 304, tank circuit 304 operates in a low frequency mode. In the low frequency mode, the output frequency of the tank circuit 304 is expressible as:

$$Fvco(\text{low}) = \frac{1}{2\pi\sqrt{L12 \times C}},$$

where

L12=L12=[L1*L2]/[L1+L2] and C=C1+C2.

Figure 3C:
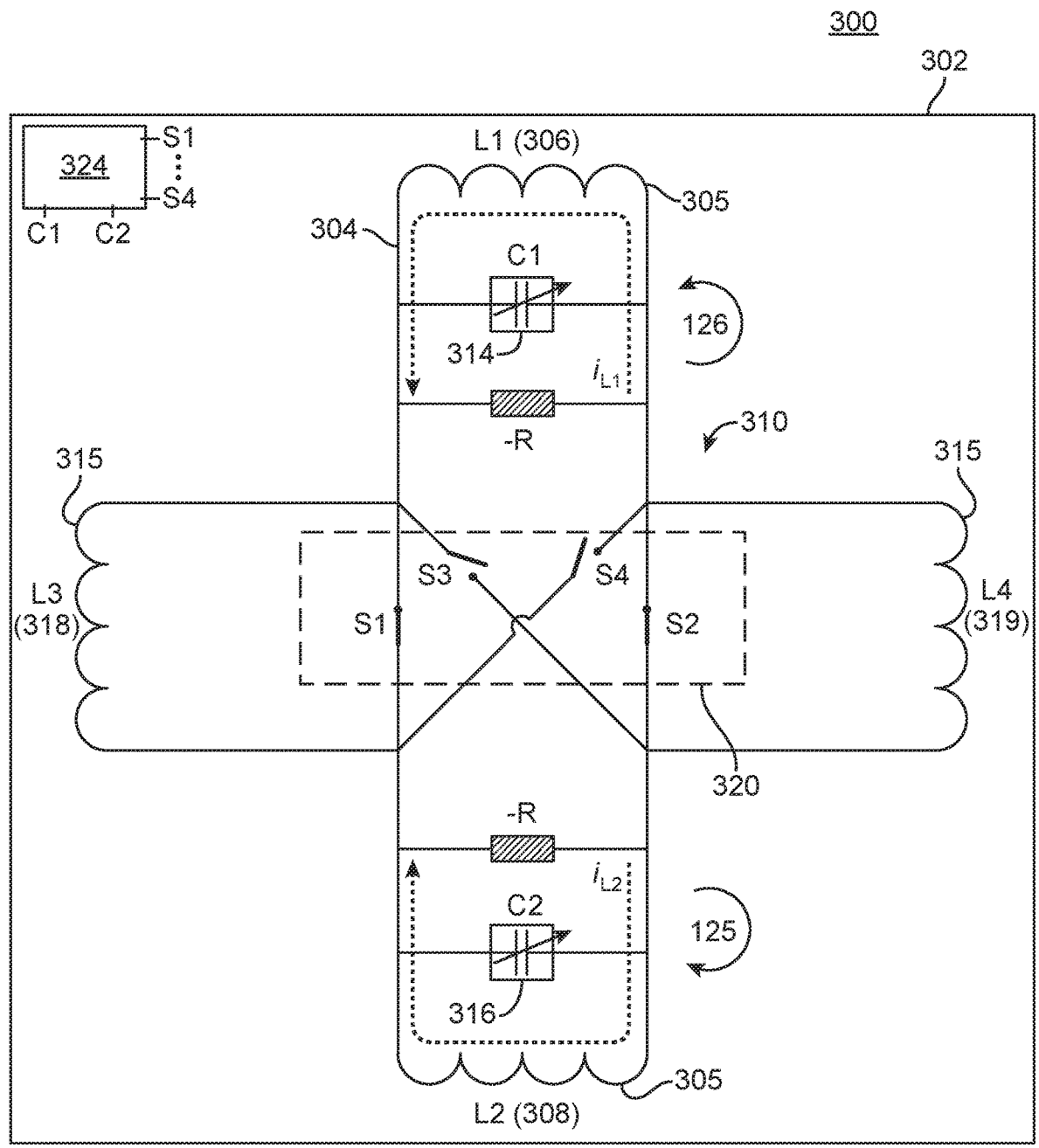
FIG. 3C also illustrates the integrated circuit of FIG. 3A operating in the first configuration, in accordance with an example of this disclosure.

FIG. 3C illustrates integrated circuit 300 operating in the first configuration 310, but at a different moment from that of FIG. 3B. In the moment illustrated in FIG. 3C, induced current iL1 in inductive loop 306 flows in a counterclockwise direction 126, whereas induced current iL2 is carried in a clockwise direction 125. The direction of current iL1 and iL2 depends on the polarity of the input voltage from the oscillation driver, (see 402, FIG. 4). During operation of the tank circuit 304 in the first configuration 310, direction of current in the tank circuit 304 will alternate between that shown in FIG. 3B and FIG. 3C.

When the tank circuit 304 is in the first configuration 310, if current iL1 in loop 306 is flowing clockwise 125, then current iL2 in loop 308 will be flowing counterclockwise 126, as in FIG. 3B. Similarly, if current iL2 in loop 308 is flowing clockwise 125, then current iL1 is flowing counterclockwise 126, as in FIG. 3C. Thus, in the first configuration 310 of tank circuit 304, the inductive loops 306, 308 of the first pair 305 carry current in opposing directions, with one loop (e.g., 306) carrying current in a first direction (e.g., clockwise 125), and the other loop (e.g., 308) carrying current in an opposing direction (e.g., counterclockwise 126).

Figure 3D:
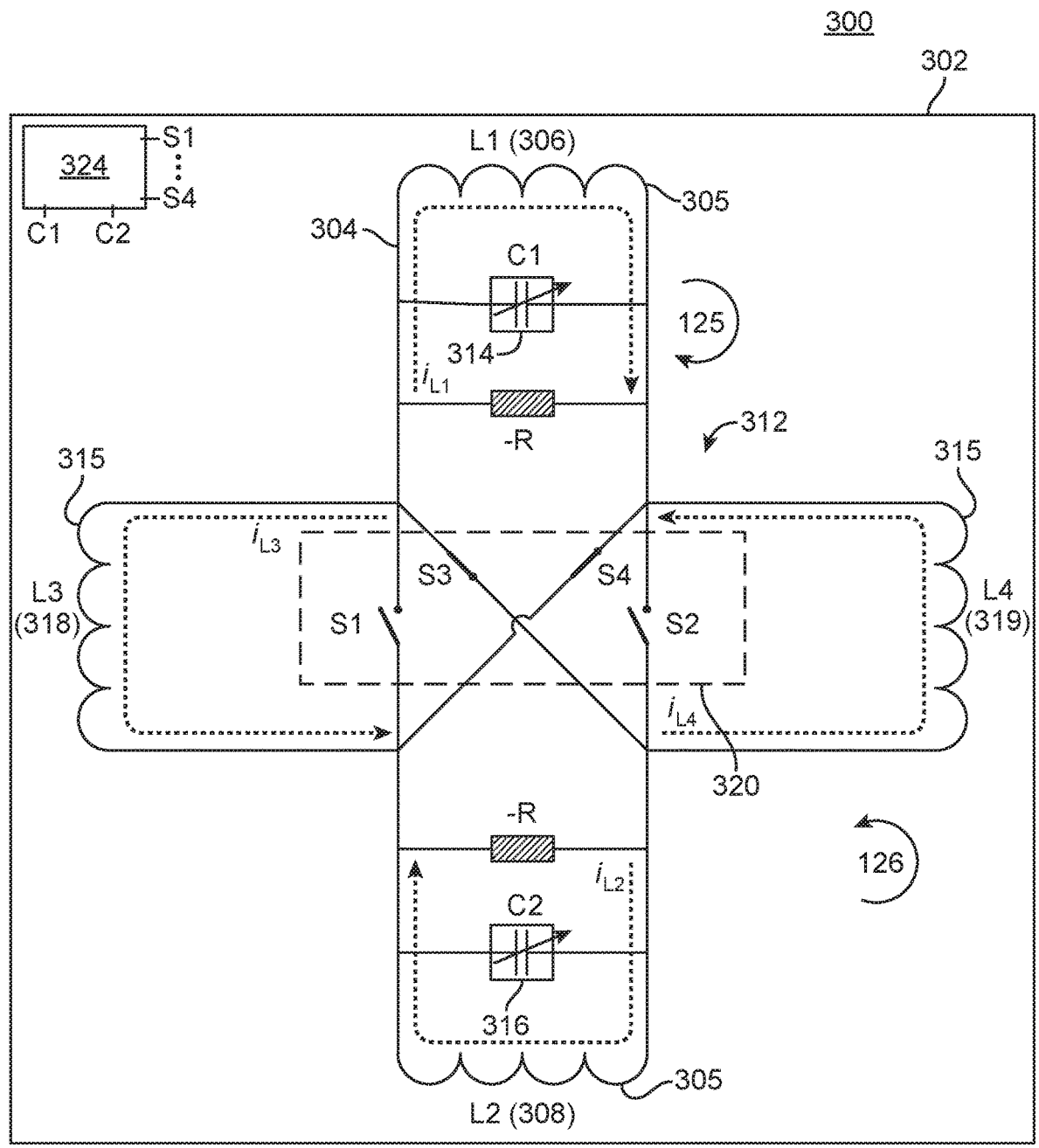
FIG. 3D illustrates the integrated circuit of FIG. 3A operating in an alternate configuration, in accordance with an example of this disclosure.

FIG. 3D illustrates integrated circuit 300 operating in a second configuration 312 at a first moment, in accordance with an example of this disclosure. In FIG. 3D, switch arrangement 320 has placed integrated circuit 300 into the second configuration 312. In the second configuration 312, switch S1 and switch S2 are open, while switch S3 and switch S4 are closed. When the tank circuit 304 is in the second configuration 312, inductive loop 306 is driven in parallel with inductive loop 308 in response to the frequency input from the oscillation driver, (see FIG. 4). When the tank circuit 304 is in the second configuration 312, inductive loop 318 is driven in parallel with inductive loop 319. When the tank circuit 304 is in the second configuration 312, the first pair 305 of inductive loops (306, 308) is driven in parallel with the second pair 315 of inductive loops (318, 319).

In the second configuration 312, the tank circuit 304 operates in a high frequency mode. In the high frequency mode, the output frequency of tank circuit 304 is expressible as:

$$Fvco(\text{high}) = \frac{1}{2\pi\sqrt{L1234 \times C}},$$

where L1234=1/[(1/L1)+(1/L2)+(1/L3)+(1/L4)] and C=C1+C2. Current iL1 is induced in inductive loop 306, current iL2 is induced in inductive loop 308, current iL3 is induced in loop 318, and current iL4 is induced in loop 319. As shown in FIG. 3D, currents iL1 and iL2 flow clockwise 125, while currents iL3 and iL4 counterclockwise 126. In at least one example, when operating in the high frequency mode, the output signal of the tank circuit 304 has a frequency of 15.2 GHz, which is 43 percent higher than the 9.8 GHz frequency of the first (low frequency) operating mode of FIGS. 3B-3C.

Figure 3E:
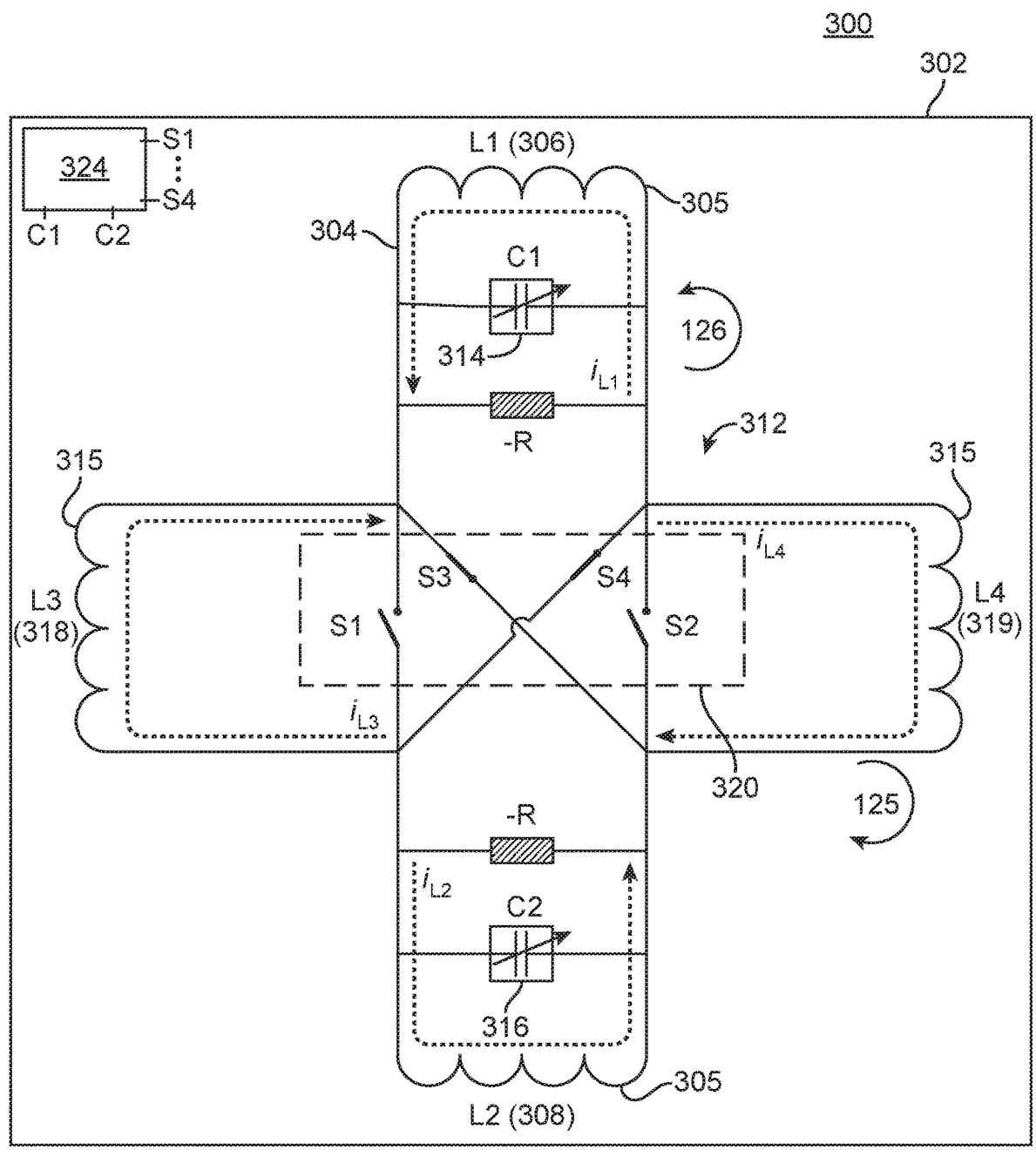
FIG. 3E also illustrates the integrated circuit of FIG. 3A operating in the alternate configuration, in accordance with an example of this disclosure.

FIG. 3E illustrates integrated circuit 300 operating in the second configuration 312, but at a different moment from that of FIG. 3D. In the moment illustrated in FIG. 3E, induced current iL1 in inductive loop 306 flows in a counterclockwise direction 126 and induced current iL2 is also carried in the counterclockwise direction 126. The direction of current in the tank circuit 304 depends on the polarity of the input voltage from the oscillation driver (see 402, FIG. 4). During operation of the tank circuit 304 in the second configuration 312, direction of current in the tank circuit 304 will alternate between that shown in FIG. 3D and that shown in FIG. 3E.

When the tank circuit 304 is in the second configuration 312, if current iL1 in loop 306 is flowing clockwise, then current iL2 in loop 308 will be flowing clockwise as well (see FIG. 3D). Similarly, if current iL2 in loop 308 is flowing counterclockwise 125, then current iL1 is also flowing counterclockwise (see FIG. 3E). Thus, in the second configuration 312 of tank circuit 304, inductive loops 306, 308 of the first pair 305 always carry current in the same direction as one another.

When the tank circuit 304 is in the second configuration 312, if current iL1 in loop 306 and current iL2 in loop 308 are flowing clockwise, then current iL3 will flow counterclockwise 126 around loop 318 and current iL4 will flow counterclockwise 126 around loop 319, (see FIG. 3D). Similarly, when the tank circuit 304 is in the second configuration 312, if current iL1 in loop 306 and current iL2 in loop 308 are flowing counterclockwise 126, then current iL3 will flow clockwise 126 around loop 318 and current iL4 will flow clockwise 125 around loop 319, (see FIG. 3E).

Thus, when the tank circuit 304 is in the second configuration 312, inductive loop 306 and inductive loop 308 carry current in a shared direction. For example, current iL1 and current iL2 will both flow clockwise 125, as illustrated in FIG. 3D, or current iL1 and current iL2 will both flow counterclockwise, as illustrated in FIG. 3D.

In the second configuration 312, inductive loop 318 and inductive loop 319 carry current in a shared direction, for example, current iL3 and current iL4 will both flow counterclockwise 126, as illustrated in FIG. 3D, or current iL3 and current iL4 will both flow clockwise 125, as illustrated in FIG. 3E.

Thus, in the second configuration 312 of the tank circuit 304, the inductive loops 306, 308 of the first pair 305 carry currents in a shared direction (e.g., clockwise 125, see FIG. 3D) that is opposite the direction of current flow in the inductive loops 318, 319 of the second pair 315 (e.g., counterclockwise 126, see FIG. 3D). The directional relationship of current flow in the tank circuit 304 is similarly illustrated in FIG. 3E, in which inductive loops 306, 308 of the first pair 305 carry currents in a shared direction (counterclockwise 126) that is opposite the direction of current flow (clockwise 125) in inductive loops 318, 319 of the second pair 315.

Figure 4:
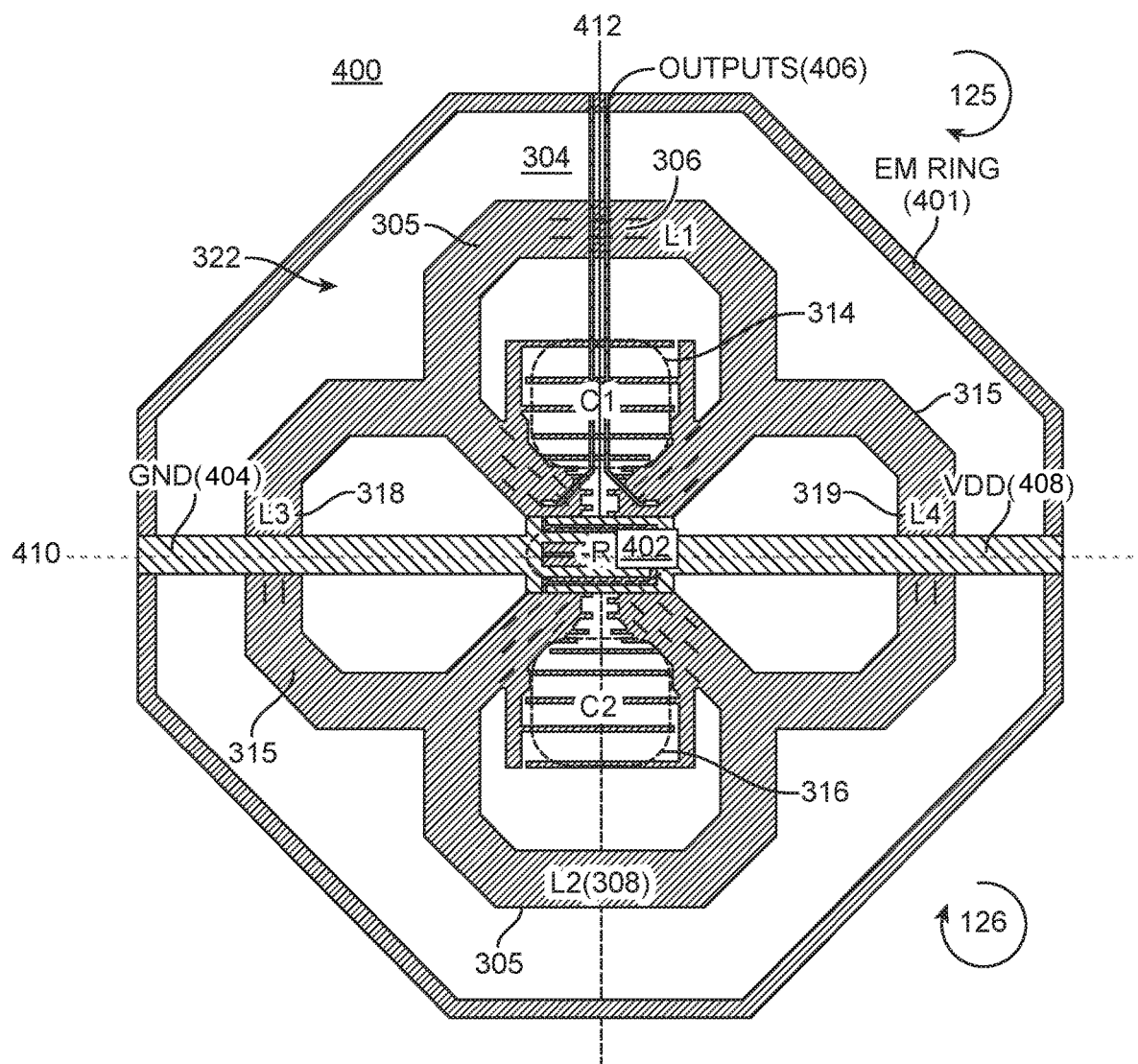
FIG. 4 illustrates aspects of the integrated circuit of FIGS. 3A-3E, in accordance with an example of this disclosure.

FIG. 4 illustrates aspects of an integrated circuit 400 (e.g., 300), in accordance with an example of this disclosure. In at least one example of this disclosure, a tank circuit 304 of the integrated circuit 400 resides on a substrate (302). Tank circuit 304 is surrounded by an electromagnetic (EM) ring 401. The integrated circuit 400 includes a driver 402 which drives components of the tank circuit 304. In at least one example, the EM ring 401 is composed of solid metal and serves to minimize unwanted coupling by circuit 400 components (e.g., tank circuit 304) with other circuitry (not shown) The tank circuit 304 includes a first inductive loop 306 and a second inductive loop 308. Inductive loop 306 and inductive loop 308 form a first pair 305 of inductive loops. Inductive loop 306 comprises an inductor L1. Inductive loop 308 also comprises an inductor L2. Inductive loop 306 encloses a capacitive element (C1) 314 and a negative resistive value (−R). In some examples of this disclosure, capacitive element C1 314 is connected to a processor (e.g., 324). The processor (324) can cause the capacitance of capacitive element C1 314 to change. Capacitive element C1 314 is connected in parallel with inductive loop 306.

Inductive loop 308 encloses a second capacitive element 316 (C2) and the negative resistive value (−R). In some examples of this disclosure, capacitive element C2 316 is connected to a processor (e.g., 324) which can control the capacitance of capacitive element C2 316. Capacitive element C2 316 is connected in parallel with inductive loop 308.

Circuit 400 also includes a third inductive loop 318 and a fourth inductive loop 319. Inductive loop 318 comprises inductor L3 and inductive loop 319 comprises inductor L4. In at least one example of this disclosure, circuit 400 is connected to a switch arrangement (e.g., 320). Switch arrangement (320) is controlled by processor (324) to place the circuit 400 into either of two operating configurations (310, 312). The circuit 400 includes an oscillation driver 402 that drives the tank circuit 304 at a resonance frequency. The resonance frequency is tunable by operation of the processor (324) on capacitive element C1 314, capacitive element C2 316, and switch arrangement (320, see FIGS. 3A-3D). The circuit 400 receives input voltage 408 and is connected to local ground 404. The input resonance frequency from driver 402 is tunable as output 406 from the circuit 400, (making the tank circuit 304 a voltage-controlled oscillator).

As shown in FIG. 4, the first pair 305 of inductive loops is spaced apart along a first axis 410 and the second pair of inductive loops 315 is spaced apart along a second axis 412 perpendicular to the first axis 410 so as to form a pattern 322 having four-fold symmetry.

Figure 5:
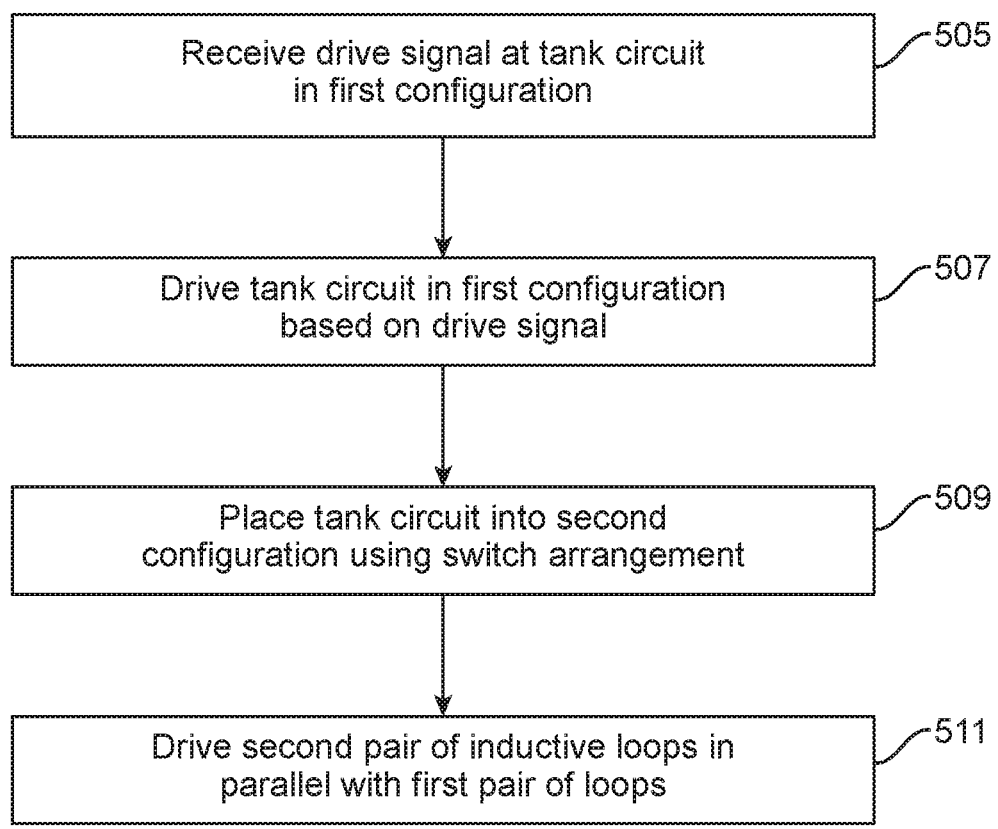
FIG. 5 illustrates a method of operating a tank circuit, in accordance with an example of this disclosure.

FIG. 5 illustrates a method 500 for operating a tank circuit (e.g., 104, 304), in accordance with an example of this disclosure. The method 500 includes receiving 505 a drive signal at a tank circuit (e.g., 104, 304) in a first configuration (e.g., 110, 310). The drive signal may come from an oscillation driver (e.g., 202, 402). The method 500 also includes driving 507 the tank circuit (e.g., 104, 304) in the first configuration (e.g., 110, 310) based on the drive signal. The method 500 also includes placing 509 the tank circuit (e.g., 104, 304) into a second configuration (e.g., 112, 312) using a switch arrangement (120, 320).

In at least one example of this disclosure, driving 507 the tank circuit (e.g., 104, 304) in the first configuration (e.g., 110, 310) comprises driving the loops in the first pair (e.g., 105, 305) in parallel. In some examples, each of the inductive loops (e.g. 106, 108) in the first pair (e.g., 105) encloses a corresponding capacitive element (e.g., 114, 116) connected in parallel with that inductive loop (e.g., 105). The method 500 also includes driving 511 a second pair (e.g., 315) of inductive loops in parallel with the first pair (e.g., 305) of loops, responsive to placing the tank circuit (e.g., 104, 304) into the second configuration (e.g., 112, 312).

In some examples of this disclosure, in method 500, driving the tank circuit (e.g., 104, 304) in the first configuration (e.g., 110, 310) based on the drive signal comprises causing the inductive loops of the first pair (e.g., 105, 305) to carry currents in opposing directions (see e.g., FIGS.

1B-1C, and FIGS. 3B-3C). In at least one example of this disclosure, method 500 also includes causing—responsive to placing the tank circuit (e.g., 104, 304) into the second configuration (e.g., 112, 312)—the inductive loops of the first pair (e.g., 105, 305) to carry currents in a shared direction (see e.g., FIGS. 1D-1E, and FIGS. 3D-3E).

Figure 6:
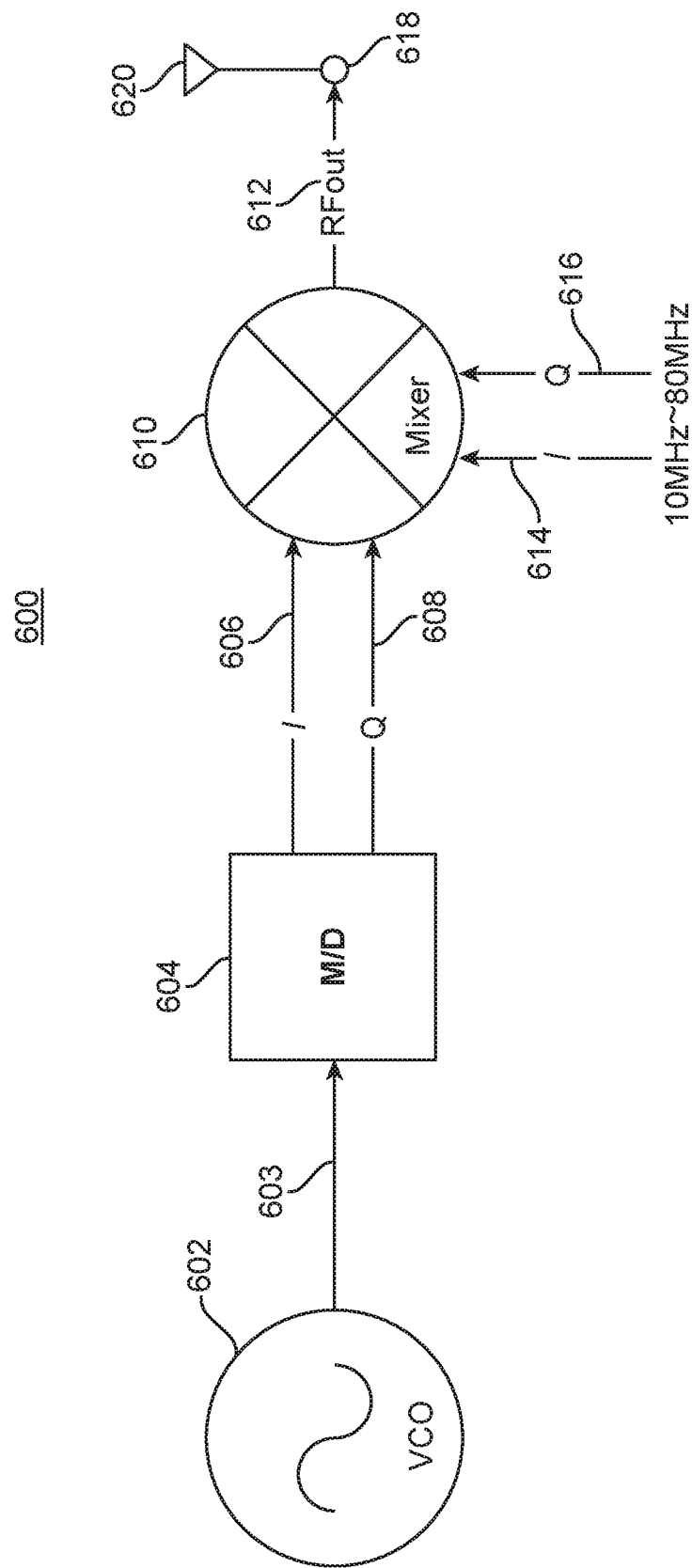
FIG. 6 illustrates an integrated signal transmitter, in accordance with an example of this disclosure.

FIG. 6 illustrates an integrated signal transmitter 600, in accordance with an example of this disclosure. Integrated signal transmitter 600 may be an integrated Wi-Fi signal transmitter. Integrated signal transmitter 600 includes a voltage-controlled oscillator (VCO) 602 (e.g., 104, 304). VCO 602 produces a signal 603 having a tunable reference frequency. In at least one example of this disclosure, VCO 602 produces a signal 603 whose (reference) frequency is tunable across a range of 9.8 GHz to 14.25 GHz. In some examples, VCO 602 produces a signal 603 having a frequency that is tunable across a range of at least 10 GHz to 14.125 GHz. VCO 602 may be used to produce signals 603 that are tunable across other ranges in accordance with this disclosure. The transmitter 600 also includes a frequency divider (M/D) 604 that converts the reference signal 603 into in-phase carrier signal (I) 606 and quadrature half-frequency carrier signal (Q) 608, each of which has a frequency which is one half the frequency of reference signal 603. Thus, when VCO 602 operates in a 9.8 GHz-14.25 GHz range, output signals (I) 606 and (Q) 608 operate in a 4.9 GHz-7.125 GHz range. The transmitter 600 also includes a mixer 610 that produces a transmit signal (RFout) 612 by combining the in-phase carrier signals (I) 606 and the quadrature half-frequency carrier signals 606 with in-phase Wi-Fi modulation signals (I) 614 and quadrature Wi-Fi modulation signals (Q) 616. As shown in the example of FIG. 6, an output pin 618 couples the transmit signal (RFout) 612 to an antenna 620.

In accordance with one or more examples of this disclosure, the VCO 602 comprises a configurable tank circuit (e.g. 104, 304) on a substrate (e.g. 102, 302). The VCO 602 includes a first pair (e.g., 105, 305) of inductive loops (e.g., 106, 108, 306, 308) driven in parallel in each of a first configuration (e.g., 110, 310) and a second configuration (e.g., 112, 312). In some examples, each of the inductive loops in the first pair (105, 305) encloses a corresponding capacitive element (e.g., 114, 116, 314, 316) connected in parallel with that inductive loop (e.g., 106, 108, 306, 308). The VCO 602 also includes a second pair (e.g., 115, 315) of inductive loops which is driven in parallel with the first pair of loops in the second configuration and undriven in the first configuration. The VCO 602 also includes a switch arrangement (e.g., 120, 320) that selectively (alternatingly) places the configurable tank circuit (e.g., 104, 304) into either of the first configuration (e.g., 110, 310) or the second configuration (e.g., 112, 312). The VCO 602 also includes an oscillation driver (e.g., 202, 402) that drives the configurable tank circuit (e.g., 104, 304) at a tunable resonance frequency.

Figure 7:
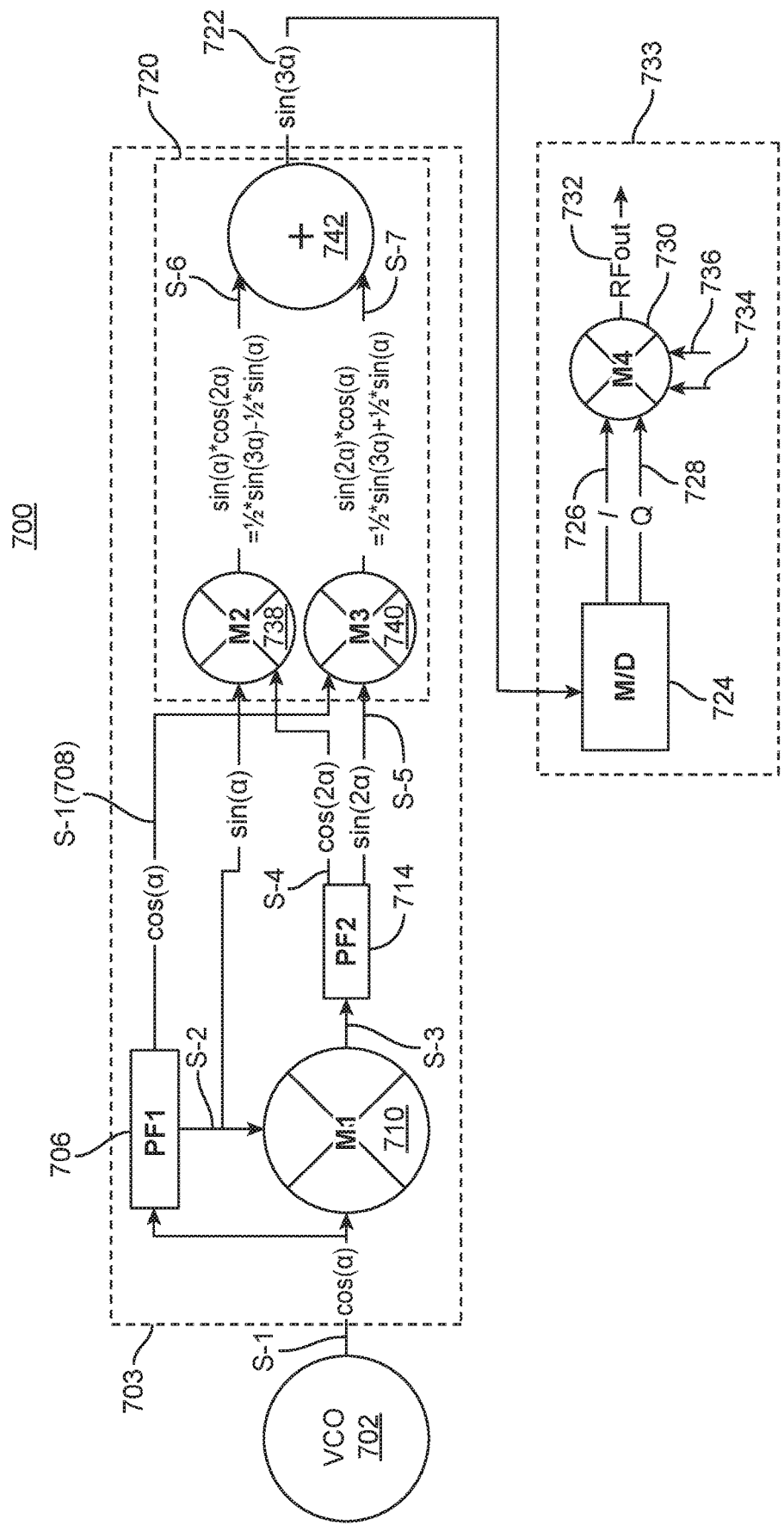
FIG. 7 illustrates another integrated signal transmitter, in accordance with an example of this disclosure.

FIG. 7 illustrates an integrated signal transmitter 700, in accordance with an example of this disclosure. The integrated signal transmitter 700 can be a Wi-Fi transmitter. The integrated signal transmitter 700 includes a VCO 702, (e.g., 104, 304) producing a reference signal S-1 having a frequency (a) that is tunable across a range of at least 3.33 GHz to 4.83 GHz. Signal S-1 is output to range expansion circuit 703. In at least one example of this disclosure, range expansion circuit 703 produces a signal 722 based on signal S-1 having a frequency which is three times greater than the frequency of signal S-1. In accord with some examples of this disclosure VCO 702 may produce a reference signal S-1 whose frequency (a) is tunable across other ranges. The value of signal S-1 corresponds to the trigonometric function cos(a). Signal S-1 is received by range expansion circuit 703 at polyphase filter (PF1) 706. Polyphase filter PF1 706 produces a copy of S-1 (an in-phase reference signal 708) and signal S-2. Signal S-2 is the same as signal S-1 except that signal S-2 is 90 degrees out of phase with signal 5-1, making signal S-2 a quadrature phase reference signal. The in-phase reference signal 708 and the quadrature phase reference signal S-2 have the same frequency (a) as the reference signal S-1. Signal S-1 corresponds to a cos(a) function and S-2 corresponds to a sin(a) function (because S-2 is 90 degrees out of phase with signal S-1.) As shown, transmitter 700 also includes a mixer (M1) 710. The mixer M1 710 combines the reference signal S-1 with the quadrature phase reference signal S-2 to produce signal S-3 having a frequency which is twice that of reference signal S-1 (a double frequency signal). That is, mixer M1 710 multiplies $\cos(\alpha)$ by $\sin(\alpha)$ to produce signal S-3. As is known in trigonometry, $\cos(\alpha)*\sin(\alpha)=\frac{1}{2}*\sin(2\alpha)-\frac{1}{2}*\sin(0)$. Since sin of zero is zero, the $-\frac{1}{2}*\sin(0)$ term is removed. Signal S-3 therefore corresponds to the function $\frac{1}{2}*\sin(2\alpha)$ and has no 'direct current' (DC) component. The frequency (2α) of signal S-3 is twice that of signal S-1. Moreover, the fact that signal S-3 is free of any DC component is advantageous to the operation of transmitter 700. Signal S-3 is output from mixer M1 710 to a second polyphase filter (PF2) 714. Polyphase filter PF2 714 includes one or more amplifiers (not shown) that double the amplitude of signal S-3 (2*0.5=1) to produce signal S-4 (cos(2α)) and signal S-5 (sin(2α)). Polyphase filter PF2 714 thus derives an in-phase double-frequency signal, signal S-4, and a quadrature phase double-frequency signal, signal S-5, from double-frequency signal S-3. The in-phase double-frequency signal S-4 and the quadrature phase double-frequency signal S-5 each have a frequency (2α) which is double the frequency (α) of signal S-1. The transmitter 700 also includes a mixer arrangement 720. Signals 5-1, S-2, S-4, and S-5 are fed to mixer arrangement 720. Notably, by generating signals S-4 and S-5, polyphase filter PF2 714 enables range expansion circuit 703 to separate wanted tones (sin(3α)) and unwanted tones (sin(α)), which enables mixer arrangement 720 to produce signal S-8. Mixer arrangement 720 combines S-1 (in-phase reference signal 708) and quadrature phase reference signal S-2 with in-phase double-frequency signal S-4 and quadrature phase double-frequency signal to produce signal 722 (S-8) whose frequency is three times that of the reference signal S-1 (a triple-frequency signal). Within mixer arrangement 720, mixer M2 738 multiplies signal S-2 (sin(α)) by signal S-4 (cos(2α)) to produce signal S-6. Since cos(2α)*sin(α) equals $\frac{1}{2}*\sin(3\alpha)-\frac{1}{2}*\sin(\alpha)$, signal S-6 corresponds to the function $\frac{1}{2}*\sin(3\alpha)-\frac{1}{2}*\sin(\alpha)$. Mixer M3 740 multiplies signal S-1 (cos(α)) by signal S-5 (sin(2α)) to produce signal S-7. Since cos(α)*sin(2α) equals $\frac{1}{2}*\sin(3\alpha)$ plus $\frac{1}{2}*\sin(\alpha)$, signal S-7 corresponds to the function $\frac{1}{2}*\sin(3\alpha)+\frac{1}{2}*\sin(\alpha)$.

Signal S-6 and signal S-7 are output to add-circuit 742. Add-circuit 742 adds signal S-6 ($\frac{1}{2}*\sin(3\alpha)-\frac{1}{2}*\sin(\alpha)$) and signal S-7 ($\frac{1}{2}*\sin(3\alpha)+\frac{1}{2}*\sin(\alpha)$) to produce signal S-8. Since the equation $\frac{1}{2}*\sin(3\alpha)-\frac{1}{2}*\sin(\alpha)+\frac{1}{2}*\sin(3\alpha)+\frac{1}{2}*\sin(\alpha)$ reduces to $\frac{1}{2}*\sin(3\alpha)+\frac{1}{2}*\sin(3\alpha)$, signal S-8 corresponds to the function sin(3α). The frequency of signal S-8 (3α) is thus three times that of signal S-1 (α) from VCO 702.

In at least one example of this disclosure, the transmitter 700 also includes output circuit 733 which receives signal S-8 at frequency divider M/D 724. Frequency divider M/D 724 converts the triple-frequency signal S-8 (722) into half-triple-frequency in-phase carrier signals (I) 726 and quadrature carrier signals (Q) 728. In at least one example, the transmitter 700 further includes a modulation mixer M4 730 that produces transmit signal RFout 732 by combining the half-triple-frequency in-phase carrier signals (I) 726 and quadrature carrier signals (Q) 728 with in-phase Wi-Fi modulation signals 734 and quadrature Wi-Fi modulation signals 736. Normally, transmit signal RFout 732 is output to one or more antennas (not shown).

Examples of this disclosure also include the following enumerated examples:

1. An integrated circuit 300 includes a substrate 302; a configurable tank circuit 304 on the substrate, the configurable tank circuit including: a first pair 305 of inductive loops 306, 308 driven in parallel in each of a first configuration 310 and a second configuration 312, each of the inductive loops 306, 308 in the first pair 305 enclosing a corresponding capacitive element 314, 316 connected in parallel with that inductive loop 306, 308; a second pair 315 of inductive loops 316, 318 driven in parallel with the first pair 305 of loops in the second configuration 312 and undriven in the first configuration 310; and a switch arrangement 320 that selectively places the configurable tank circuit 304 into either of the first and second configurations; and an oscillation driver 202 that drives the configurable tank circuit at a tunable resonance frequency.

2. The integrated circuit of example 1, wherein each corresponding capacitive element 314, 116 is an interdigitated capacitor.

3. The integrated circuit of example 1 or 2, wherein each of the inductive loops in the first pair is an inner loop enclosed within an outer loop, the outer loop being an inductive loop of the second pair.

4. The integrated circuit of example 1 or 2 or 3, wherein at least in the first configuration, the inductive loops of the first pair carry currents in opposing directions.

5. The integrated circuit of example 1 or 2 or 3 or 4, wherein in the second configuration, the inductive loops of the first pair carry currents in a shared direction.

6. The integrated circuit of example 3, wherein in the second configuration, each inner loop carries current in a shared direction with its outer loop.

7. The integrated circuit of any of the preceding examples, wherein the tunable resonance frequency is tunable across at least a range of 10 GHz to 14.125 GHz.

8. The integrated circuit of example 2, wherein the first pair 305 of inductive loops is spaced apart along a first axis and the second pair of inductive loops 315 is spaced apart along a second axis perpendicular to the first axis so as to form a pattern having four-fold symmetry.

9. The integrated circuit of example 8, wherein at least in the first configuration, the inductive loops of the first pair carry currents in opposing directions.

10. The integrated circuit of example 8 or 9, wherein in the second configuration, the inductive loops of the first pair carry currents in a shared direction that is opposite a direction of current flow in the inductive loops of the second pair.

11. The integrated circuit of example 8 or 9 or 10, wherein the tunable resonance frequency is tunable across at least a range of 9.8 GHz to 15.2 GHz.

12. The integrated circuit of any of the preceding examples, wherein the oscillation driver includes a voltage-tunable capacitance that enables tuning of the tunable resonance frequency.

13. An integrated Wi-Fi signal transmitter that comprises: a voltage-controlled oscillator (VCO) 602 producing a reference frequency 503 that is tunable across a range of at least 10 GHz to 14.125 GHz; a frequency divider 504 that converts the reference frequency 603 into in-phase carrier signals (I) 606 and quadrature half-frequency carrier signals (Q) 608; a mixer 610 that produces a transmit signal (RFout) 612 by combining the in-phase carrier signals and the quadrature half-frequency carrier signals with in-phase Wi-Fi modulation signals (I) 614 and quadrature Wi-Fi modulation signals (Q) 616; and an output pin 618 that couples the transmit signal (RFout) 612 to an antenna.

14. The integrated Wi-Fi signal transmitter of example 13, wherein the VCO includes: a configurable tank circuit on a substrate, the configurable tank circuit including: a first pair of inductive loops driven in parallel in each of a first configuration and a second configuration, each of the inductive loops in the first pair enclosing a corresponding capacitive element connected in parallel with that inductive loop; a second pair of inductive loops driven in parallel with the first pair of loops in the second configuration and undriven in the first configuration; and a switch arrangement that selectively places the configurable tank circuit into either of the first and second configurations; and an oscillation driver that drives the configurable tank circuit at a tunable resonance frequency.

15. The integrated Wi-Fi signal transmitter of example 13 or 14, wherein each of the inductive loops in the first pair is an inner loop enclosed within an outer loop, the outer loop being an inductive loop of the second pair.

16. The integrated Wi-Fi signal transmitter of example 13 or 14, wherein the first pair of inductive loops is spaced apart along a first axis and the second pair of inductive loops is spaced apart along a second axis perpendicular to the first axis, thereby forming a pattern having four-fold symmetry.

17. A method of manufacturing an integrated circuit with an on-chip voltage-controlled oscillator, the method comprising: providing a configurable tank circuit on an integrated circuit substrate, the configurable tank circuit including: a first pair of inductive loops driven in parallel in each of a first configuration and a second configuration, each of the inductive loops in the first pair enclosing a corresponding capacitive element connected in parallel with that inductive loop; a second pair of inductive loops driven in parallel with the first pair of loops in the second configuration and undriven in the first configuration; and a switch arrangement that selectively places the configurable tank circuit into either of the first and second configurations; and coupling an oscillation driver to drive the configurable tank circuit at a tunable resonance frequency, the oscillation driver including a voltage-tunable capacitor that enables tuning of the tunable resonance frequency.

18. The method of example 17, wherein each of the inductive loops in the first pair is an inner loop enclosed within an outer loop, the outer loop being an inductive loop of the second pair.

19. The method of example 17 or 18, wherein the tunable resonance frequency is tunable across at least a range of 10 GHz to 14.125 GHz.

20. The method of example 17, wherein the first pair of inductive loops is spaced apart along a first axis and the second pair of inductive loops is spaced apart along a second axis perpendicular to the first axis, in a pattern having four-fold symmetry.

21. The method of any one of examples 17-20, wherein the tunable resonance frequency is tunable across at least a range of 9.8 GHz to 15.2 GHz.

22. An integrated Wi-Fi signal transmitter 700 that comprises: a voltage-controlled oscillator (VCO) 702 producing a reference signal 704 having a reference frequency that is tunable across a range of at least 3.33 GHz to 4.83 GHz; a first filter 706 that derives an in-phase reference signal 708 and a quadrature phase reference signal 709 from the reference signal, the in-phase reference signal and the quadrature phase reference signal having the reference frequency; a first mixer M1 710 that combines the in-phase reference signal 704 with the quadrature phase reference signal 709 to produce a double-frequency signal 712; a second filter 714 that derives an in-phase double-frequency signal 716 and a quadrature phase double-frequency signal 718 from the double-frequency signal 712, the in-phase double-frequency signal and the quadrature phase double-frequency signal each having twice the reference frequency; and a mixer 720 arrangement that combines the reference signal 704 and the quadrature phase reference signal 709 with the in-phase double-frequency signal 716 and the quadrature phase double-frequency signal 718 to produce a triple-frequency signal 722.

23. The integrated Wi-Fi signal transmitter of example 22, further comprising: a frequency divider M/D 724 that converts the triple-frequency signal into half-triple-frequency in-phase carrier signals (I) 726 and quadrature carrier signals (Q) 728; and a modulation mixer M4 730 that produces a transmit signal RFout 732 by combining the half-triple-frequency in-phase carrier signals and quadrature carrier signals with in-phase Wi-Fi modulation signals (I) 734 and quadrature Wi-Fi modulation signals (Q) 736.

24. The integrated Wi-Fi signal transmitter of example 22, wherein the mixer arrangement comprises: a second mixer that combines the in-phase reference signal with the quadrature phase double-frequency signal to produce a first up-converted signal with a positive harmonic; a third mixer that combines the quadrature phase reference signal with the in-phase double-frequency signal to produce a second up-converted signal with a negative harmonic; and an add-circuit that sums the first up-converted signal and the second up-converted signal to produce the triple-frequency signal.

25. The integrated Wi-Fi signal transmitter of example 22, wherein the mixer arrangement includes a mixer that combines the in-phase reference signal with the quadrature phase double-frequency signal to produce a first up-converted signal. In at least one example, the first up-converted reference has a positive harmonic. The mixer arrangement also includes a third mixer that combines the quadrature phase reference signal with the in-phase double-frequency signal to produce a second up-converted signal. In at least some examples, the second up-converted signal is characterized by a negative harmonic. The mixer arrangement also includes an add-circuit that sums the first up-converted signal and the second up-converted signal to produce the triple-frequency signal.

Though the operations described herein may be set forth sequentially for explanatory purposes, in practice the method may be carried out by multiple components operating concurrently and perhaps even speculatively to enable out-of-order operations. The sequential discussion is not meant to be limiting. Modifications, equivalents, and alternatives, should be apparent to those skilled in the art. It is intended that the following claims be interpreted to embrace all such modifications, equivalents, and alternatives.

What is claimed is:

1. An integrated circuit comprising:
    a substrate;
    a configurable tank circuit on the substrate, the configurable tank circuit including:
        a first pair of inductive loops driven in parallel in each of a first configuration and a second configuration, each of the inductive loops in the first pair enclosing a corresponding capacitive element connected in parallel with that inductive loop;
        a second pair of inductive loops driven in parallel with the first pair of loops in the second configuration, the second pair of inductive loops undriven in the first configuration; and
        a switch arrangement that alternately places the configurable tank circuit into either the first configuration or the second configuration; and
    an oscillation driver that drives the configurable tank circuit at a tunable resonance frequency.

2. The integrated circuit of claim 1, wherein each of the inductive loops in the first pair is an inner loop enclosed within an outer loop, the outer loop being an inductive loop of the second pair.

3. The integrated circuit of claim 2, wherein at least in the first configuration, the inductive loops of the first pair carry currents in opposing directions.

4. The integrated circuit of claim 2, wherein in the second configuration, each inner loop carries current in a shared direction with its outer loop.

5. The integrated circuit of claim 2, wherein the tunable resonance frequency is tunable across a range having a width of at least 4.0 GHz.

6. The integrated circuit of claim 1, wherein each corresponding capacitive element is an interdigitated capacitor.

7. The integrated circuit of claim 6, wherein the first pair of inductive loops is spaced apart along a first axis and the second pair of inductive loops is spaced apart along a second axis perpendicular to the first axis so as to form a cloverleaf pattern.

8. The integrated circuit of claim 7, wherein the tunable resonance frequency is tunable across a range in accord with a wireless protocol.

9. The integrated circuit of claim 7, wherein at least in the first configuration, the inductive loops of the first pair carry currents in opposing directions.

10. The integrated circuit of claim 9, wherein in the second configuration, the inductive loops of the first pair carry currents in a shared direction that is opposite a direction of current flow in the inductive loops of the second pair.

11. The integrated circuit of claim 1, wherein the oscillation driver includes a voltage-tunable capacitance that enables tuning of the tunable resonance frequency.

12. The integrated circuit of claim 1, wherein in the second configuration, the inductive loops of the first pair carry currents in a shared direction.

13. An integrated wireless communication signal transmitter that comprises:
    a voltage-controlled oscillator producing a reference frequency;
    a frequency divider that converts the reference frequency into in-phase carrier signals and quadrature half-frequency carrier signals;
    a mixer that produces a transmit signal by combining the in-phase carrier signals and the quadrature half-frequency carrier signals with in-phase wireless modulation signals and quadrature wireless modulation signals; and
    an output pin that couples the transmit signal to an antenna.

14. The integrated wireless communication signal transmitter of claim 13, wherein the voltage-controlled oscillator includes:
- a configurable tank circuit on a substrate, the configurable tank circuit including:
  - a first pair of inductive loops driven in parallel in each of a first configuration and a second configuration, each of the inductive loops in the first pair enclosing a corresponding capacitive element connected in parallel with that inductive loop;
  - a second pair of inductive loops driven in parallel with the first pair of loops in the second configuration, the second pair of inductive loops undriven in the first configuration; and
  - a switch arrangement that alternately places the configurable tank circuit into either the first configuration or the second configuration; and
- an oscillation driver that drives the configurable tank circuit at a tunable resonance frequency.

15. The integrated wireless communication signal transmitter of claim 14, wherein each of the inductive loops in the first pair is an inner loop enclosed within an outer loop, the outer loop being an inductive loop of the second pair.

16. The integrated wireless communication signal transmitter of claim 14, wherein the first pair of inductive loops is spaced apart along a first axis and the second pair of inductive loops is spaced apart along a second axis perpendicular to the first axis, thereby forming a pattern having four-fold symmetry.

17. A method of operating a tank circuit, comprising:
- receiving a drive signal at a tank circuit in a first configuration;
- driving the tank circuit in the first configuration based on the drive signal, wherein driving the tank circuit in the first configuration comprises driving a first pair of inductive loops in parallel, and wherein each of the inductive loops in the first pair encloses a corresponding capacitive element connected in parallel with that inductive loop;
- placing, using a switch arrangement, the tank circuit into a second configuration; and
- driving, responsive to placing the tank circuit into the second configuration, a second pair of inductive loops in parallel with the first pair of loops.

18. The method of claim 17, wherein driving the tank circuit in the first configuration based on the drive signal comprises causing the inductive loops of the first pair to carry currents in opposing directions.

19. The method of claim 17, further comprising causing, responsive to placing the tank circuit into the second configuration, the inductive loops of the first pair carry currents in a shared direction.

20. An integrated wireless communication signal transmitter, comprising:
- a voltage-controlled oscillator producing a reference signal having a reference frequency;
- a first filter that derives an in-phase reference signal and a quadrature phase reference signal from the reference signal, the in-phase reference signal and the quadrature phase reference signal having the reference frequency;
- a first mixer that combines the in-phase reference signal with the quadrature phase reference signal to produce a double-frequency signal;
- a second filter that derives an in-phase double-frequency signal and a quadrature phase double-frequency signal from the double-frequency signal, the in-phase double-frequency signal and the quadrature phase double-frequency signal each having twice the reference frequency; and
- a mixer arrangement that combines the reference signal and the quadrature phase reference signal with the in-phase double-frequency signal and the quadrature phase double-frequency signal to produce a triple-frequency signal.

21. The integrated wireless communication signal transmitter of claim 20, further comprising:
- a frequency divider that converts the triple-frequency signal into half-triple-frequency in-phase carrier signals and quadrature carrier signals; and
- a modulation mixer that produces a transmit signal by combining the half-triple-frequency in-phase carrier signals and quadrature carrier signals with in-phase and quadrature wireless modulation signals.

22. The integrated wireless communication signal transmitter of claim 20, wherein the mixer arrangement comprises:
- a second mixer that combines the in-phase reference signal with the quadrature phase double-frequency signal to produce a first up-converted signal with a positive harmonic;
- a third mixer that combines the quadrature phase reference signal with the in-phase double-frequency signal to produce a second up-converted signal with a negative harmonic; and
- an add-circuit that sums the first up-converted signal and the second up-converted signal to produce the triple-frequency signal.

* * * * *